(12) United States Patent
Kimura

(10) Patent No.: US 7,622,967 B2
(45) Date of Patent: Nov. 24, 2009

(54) PHASE SHIFTING CIRCUIT HAVING A CONSTANT PHASE SHIFT

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/902,168

(22) Filed: Sep. 19, 2007

(65) Prior Publication Data

US 2008/0088351 A1    Apr. 17, 2008

(30) Foreign Application Priority Data

Sep. 21, 2006    (JP)  ............................. 2006-255763

(51) Int. Cl.
    *H03L 7/06*    (2006.01)
(52) U.S. Cl. ...................... 327/156; 327/244
(58) Field of Classification Search ................. 327/244, 327/156
    See application file for complete search history.

(56) References Cited

U.S. PATENT DOCUMENTS

| 4,450,410 | A | * | 5/1984 | Kliger et al. ................ 327/157 |
| 5,208,546 | A | * | 5/1993 | Nagaraj et al. .............. 327/157 |
| 6,057,723 | A |   | 5/2000 | Yamaji et al. |
| 6,157,235 | A | * | 12/2000 | Bautista et al. ............. 327/254 |
| 6,876,185 | B2 | * | 4/2005 | Niratsuka ................ 324/76.53 |
| 2005/0253633 | A1 | * | 11/2005 | Kimura ...................... 327/156 |

FOREIGN PATENT DOCUMENTS

JP    10-200376    7/1998

* cited by examiner

*Primary Examiner*—Lincoln Donovan
*Assistant Examiner*—John W Poos
(74) *Attorney, Agent, or Firm*—McGinn IP Law Group, PLLC

(57) ABSTRACT

Disclosed is a phase shifting circuit that includes a PLL loop in which a reference frequency received is branched into first and second signals. The first signal becomes one input to a phase comparator and the second signal becomes another input to the phase comparator after being shifted in phase via a phase shifter. The output of the phase comparator is supplied to one input terminal of a differential amplifier via a low-pass filter. The amount of phase shift of the phase shifter is controlled by the output signal of the differential amplifier. The amount of phase shift of the phase shifter is decided by a reference voltage applied to another input terminal of the differential amplifier.

19 Claims, 18 Drawing Sheets

$f_{LO1(I)}$ $f_{LO1(Q)}$ $2 f_{LO1}$

INPUT/OUTPUT WAVEFORM OF
JOHNSON COUNTER

JOHNSON COUNTER

US 7,622,967 B2

PHASE SHIFTING CIRCUIT HAVING A CONSTANT PHASE SHIFT

REFERENCE TO RELATED APPLICATIONS

The present application is claiming the priority of the earlier Japanese patent application No. 2006-255763 filed on Sep. 21, 2006, the entire disclosure thereof being incorporated herein by reference thereto.

FIELD OF THE INVENTION

This invention relates to a phase shifting circuit and, more particularly, to a highly accurate phase shifting circuit formed on a semiconductor integrated circuit.

BACKGROUND OF THE INVENTION

Mobile wireless terminals and the like use quadrature demodulation. Generally, a local (LO) signal is imparted with a phase difference of $\pi/2$ and a frequency conversion is applied using two mixers. Alternatively, if a subharmonic mixer is used, it is necessary that the LO signal be provided with a phase difference of $\pi/4$. For example, usually a circuit employing an RC-CR circuit illustrated in FIG. 14 is used as a 90° ($\pi/2$) phase shifter for this purpose. Recently, however, it has become common practice to adopt a direct-conversion-type receiving scheme in which a radio-frequency (RF) signal is directly converted to a baseband signal. There are many cases where the local frequency is set to a frequency that is twice the radio frequency and is then frequency-divided by 2 using a Johnson counter comprising flip-flops illustrated in FIG. 15A, whereby a phase difference of $\pi/2$ is obtained. FIG. 15B is a diagram illustrating the operating waveforms of the circuit shown in FIG. 15A. Here first and second flip-flops (FF) are driven by a signal $2f_{LO1}$ obtained by frequency-multiplying a signal $f_{LO1}$. A signal $f_{LO1(I)}$ (in-phase signal) is obtained from the Q output of the first flip-flop, and a signal $f_{LO1(Q)}$ (quadrature signal), which has a phase difference of 90° ($\pi/2$) with respect to the in-phase signal, is obtained from the /Q output of the second flip-flop.

A receiving scheme referred to as a "low-IF scheme", which is one type of superheterodyne reception, also is available. This scheme lowers the intermediate frequency (IF) to obtain a frequency band that facilitates integration. The low-IF scheme also uses quadrature demodulation and requires that the local signal be imparted with a phase difference of $\pi/2$. In this case, the radio frequency and local frequency differ by the intermediate frequency and therefore this scheme is not that vigorous in relation to the problems of self-mixing and local spurious phenomena. In addition, a phase difference of $\pi/4$ imposed upon the local signal required in a subharmonic mixer is attended by particular difficulties in the case of high frequencies.

A phase shifter for obtaining a phase difference of $\pi/4$ for this purpose is described in the specification of Patent Document 1 (Japanese Patent Kokai Publication No. JP-A-10-200376). This phase shifter comprises two RC active bandpass filters that employ operational amplifiers in the IF band in the vicinity of 10.7 MHz. Specifically, in a first RC active bandpass filter (BPF) 21, assume that the R and C constants are R1=5 k$\Omega$, R2=10 k$\Omega$ and C=1.74 pF, and in a second RC active bandpass BPF 22, assume that the RC constants are R1=5 k$\Omega$, R2=10 k$\Omega$ and C=3.10 pF. Even if there are variations in manufacture of the integrated circuit and the absolute values of the resistors R1, R2 and capacitors C shift from their design values, the ratio between the resistors R1, R2 and the ratio between the capacitors C are held substantially constant. Therefore, if the ratio between the CR time constants is taken, it can be expected that this ratio also will be substantially constant.

Accordingly, as illustrated in FIGS. 17A and 17B, which show the amplitude-frequency and phase-frequency characteristics, respectively, it can be expected that the phase difference between the BPFs will be substantially constant even if the center frequency shifts from the design value in the desired BPF.

In actuality, R1 and R2 in the first RC active BPF 21 and second RC active BPF 22 are set to equal values and R1:R2=1:2 holds. Since the ratio between R1 and R2 is an integral value, it is easy to maintain the resistance ratio between the first RC active BPF 21 and the second RC active BPF 22.

With regard to the capacitors C, however, the value is 1.74 pF in the first RC active BPF 21 and 3.10 pF in the second RC active BPF 22. This ratio is 3.10/1.74=1.7816 and is not an integral value.

It is actually very difficult, therefore, to maintain the capacitor ratio at a constant value between the first RC active BPF 21 and second RC active BPF 22. If parasitic capacitance also is taken into consideration, it is essentially impossible to hold constant the value of such a fractional capacitor ratio. It goes without saying that the value of parasitic capacitance accompanying resistor and the value of parasitic capacitance accompanying capacitor have an impact upon the frequency characteristic of an RC active BPF.

The value of parasitic capacitance accompanying resistor and the value of parasitic capacitance accompanying capacitor do not fluctuate that much owing to variations in manufacture, and a value on the order of several tenths of picofarads can be expected. However, if the value of resistance and the value of capacitance each exhibit a manufacture-related variation of ±20% and the sum total of the intended capacitance values (1.74 pF and 3.10 pF, respectively) of the value of parasitic capacitance accompanying resistor and the value of parasitic capacitance accompanying capacitor exhibits a manufacture-related variation of ±20% with respect to the intended capacitance value, then the ratio between the first RC active BPF 21 and second RC active BPF 22 will not be constant.

In the case of high frequency, on the other hand, the combination is changed to a combination of an RC allpass filter and buffer amplifier instead of the combination of RC active BPFs, as illustrated in FIG. 18.

In order to obtain a phase difference of $\pi/4$, the R and C values are as follows: R=168$\Omega$, C=1.5 pF in a first RC allpass filter 43, and R=120$\Omega$, C=1.0 pF in a second RC allpass filter 44.

With these values, we have the ratios 168$\Omega$:112$\Omega$=3:2, 1.5 pF/1.0 pF=3:2, all of which are small natural numbers. Even if the sum total of the intended capacitance values (1.5 pF and 1.0 pF, respectively) of the value of parasitic capacitance that accompanies resistor and the value of parasitic capacitance that accompanies capacitor exhibits a manufacture-related variation of ±20% with respect to the intended capacitance value, the ratio between the first RC allpass filter 43 and the second RC allpass filter 44 is set so as to be substantially constant.

Specifically, if we assume that unit resistor and unit capacitor are 56$\Omega$ and 0.5 pF, respectively, and letting a, b and c represent parasitic capacitance that accompanies the unit resistor, parasitic capacitance that accompanies the unit capacitor and amount of change per unit capacitor due to variation in manufacture, respectively, the following holds for the first RC allpass filter 43:

$$R_{total1} = 56\Omega \times 3$$
$$= 168\Omega,$$

$$C_{total1} = 3a + 3b + 3 \times (0.5\ pf + c)$$
$$= 3 \times (a + b + c + 0.5\ \text{pF})$$

On the other hand, the following holds for the first RC allpass filter 44:

$$R_{total2} = 56\Omega \times 2$$
$$= 112\Omega,$$

$$C_{total2} = 2a + 2b + 2 \times (0.5\ pf + c)$$
$$= 2 \times (a + b + c + 0.5\ \text{pF})$$

Accordingly, we have the following:

$$R_{total1} \times C_{total1}/(R_{total2} \times C_{total2}) = 3 \times 3/(2 \times 2) = (3/2)^2$$

Thus, even if there are manufacturing variations and parasitic capacitance, the design is such that the time-constant ratio is held constant between the first RC allpass filter 43 and second RC allpass filter 44. It can be expected that the time-constant ratio will be substantially constant even if the device is implemented in an integrated circuit.

[Patent Document 1] Japanese Patent Application Kokai Publication No. JP-A-10-200376

The conventional circuitry described above has certain problems, described below.

The first problem is large variation. The reason is that implementation is by an open-loop circuit.

The second problem is that it is difficult to provide a function for varying amount of phase electronically or for adjusting it over a very small range.

The reason for the second problem is that the amount of phase is decided by the relative precision of the elements of the RC filter.

SUMMARY OF THE DISCLOSURE

Accordingly, the present invention has been devised in view of the foregoing problems and its object is to provide a phase shifting circuit in which a PLL loop is constructed to exercise control in such a manner that the amount of phase shift is held constant at all times.

Another object of the present invention is to provide a phase shifting circuit for improving characteristic and performance, mitigating effects when power supply voltage fluctuates and effects of element variation, and improving accuracy.

According to a first aspect of the present invention, there is provided a phase shifting circuit including a PLL loop in which a reference frequency is received and branched into first and second signals; the first signal becomes one input to a phase comparator and the second signal becomes another input to the phase comparator after being shifted in phase via a phase shifter; the output of the phase comparator is supplied to one input terminal of a differential amplifier via a low-pass filter; and the amount of phase shift of the phase shifter is controlled by the output signal of the differential amplifier; wherein the amount of phase shift of the phase shifter is decided by a reference voltage applied to another input terminal of the differential amplifier.

In the present invention, the low-pass filter and differential amplifier are combined to form an active low-pass filter.

In the present invention, first and second frequency dividers that divide frequency by mutually identical numbers may be inserted in front of respective ones of the two input terminals of the phase comparator.

In the present invention, the reference voltage is one-fourth of power supply voltage, and the amount of phase shift is π/4.

According to a second aspect of the present invention, there is provided a phase shifting circuit including a PLL loop in which a reference frequency is received and is then branched into first and second signals after being shifted in phase via a first phase shifter; the first frequency signal becomes one input to a phase comparator and the second frequency signal becomes another input to the phase comparator after being shifted in phase via a second phase shifter; the output of the phase comparator is supplied to one input terminal of a differential amplifier via a low-pass filter; and the amounts of phase shift of the first and second phase shifters are controlled by the output signal of the differential amplifier; wherein the amounts of phase shift of the phase shifters are decided by a reference voltage applied to another input terminal of the differential amplifier.

In the present invention, the low-pass filter and differential amplifier are combined to form an active low-pass filter.

In the present invention, first and second frequency dividers that divide frequency by mutually identical numbers are inserted in front of respective ones of the two input terminals of the phase comparator.

In the present invention, the reference voltage is one-fourth of power supply voltage, the amount of phase shift of each phase shifter is π/4, and the sum of the amounts of phase shift is π/2.

According to a third aspect of the present invention, there is provided a phase shifting circuit including a PLL loop in which a reference frequency signal becomes one input to a phase comparator; the output of a VCO (voltage-controlled oscillator) becomes another input to the phase comparator; the output of the phase comparator is supplied to one input terminal of a differential amplifier via a low-pass filter; and the VCO is controlled by the output signal of the differential amplifier; wherein the amount of phase shift of the phase shifter is decided by a reference voltage applied to another input terminal of the differential amplifier.

In the present invention, the low-pass filter and differential amplifier are combined to form an active low-pass filter.

In the present invention, first and second frequency dividers that divide frequency by mutually identical numbers may be inserted in front of respective ones of the two input terminals of the phase comparator.

In the present invention, the reference voltage is one-half of power supply voltage, and the amount of phase shift is π/2.

In the present invention, the phase shifting circuit may have means for varying the reference voltage, wherein the amount of phase shift of the phase shifter is made freely variable.

The meritorious effects of the present invention are summarized as follows.

In accordance with the present invention, the amount of phase shift of a phase shifter is controlled by a PLL. This makes it possible for the amount of phase shift of the phase shifter to be kept constant.

In accordance with the present invention, the amount of phase shift of a phase shifter in a PLL loop is decided upon obtaining a reference voltage from a power supply voltage. This makes it possible to diminish the effects of variations.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Preferred modes of the present invention will be described in detail with reference to the drawings.

Figure 1:
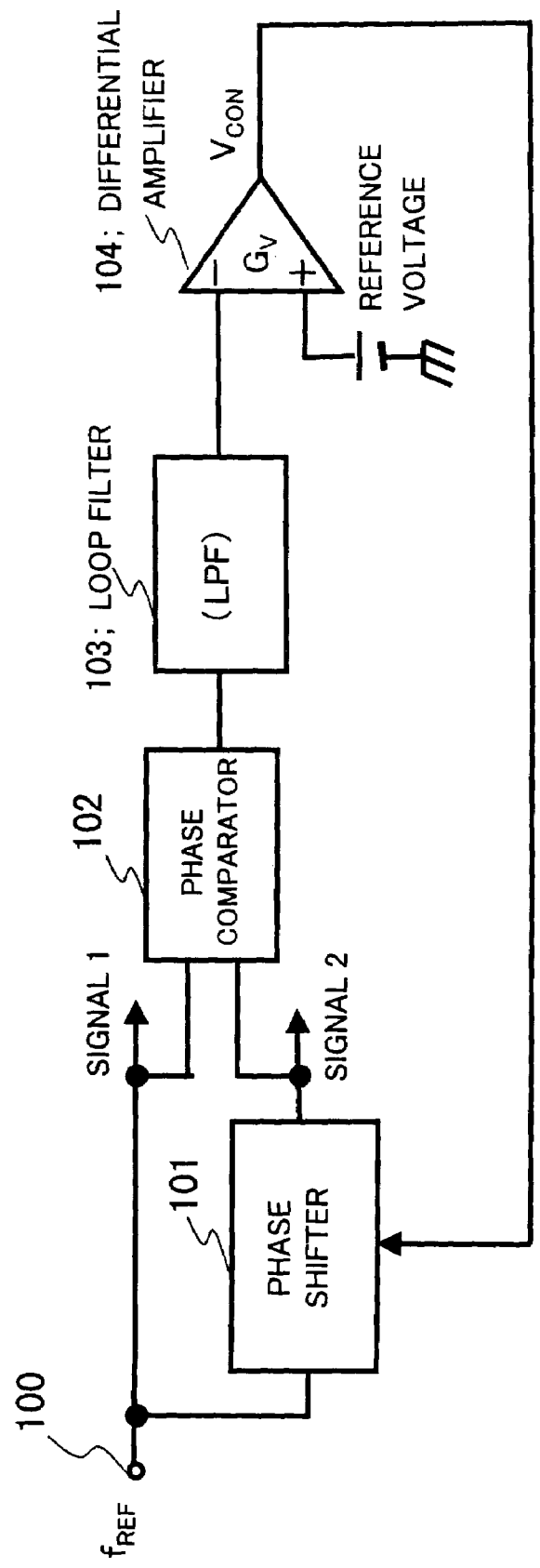
FIG. 1 is a block diagram illustrating the configuration of an example of the present invention.

FIG. 1 is a block diagram illustrating the configuration of a phase shifting circuit according to the present invention. As shown in FIG. 1, a reference frequency $f_{REF}$ is supplied from an input terminal 100. The frequency signal becomes one input signal 1 to a phase comparator 102. The frequency signal $f_{REF}$ is also phase-shifted by a phase shifter 101 and becomes another input signal 2 to the phase comparator 102. Accordingly, the two input signals utilized as the inputs to the phase comparator 102 are a signal 1 and a signal 2 having a phase difference between them.

The output signal of the phase comparator 102 is a rectangular waveform. A DC voltage is obtained by smoothing this signal by a loop filter (LPF) 103 comprising a low-pass filter. This voltage is amplified by a differential amplifier 104 (the voltage gain of which is $-G_V$) and becomes a control voltage $V_{CON}$ of the phase shifter 101. It is assumed that the phase shifter 101 applies a large delay when the control voltage $V_{CON}$ is high. Accordingly, this arrangement constructs a negative feedback loop, namely a PLL loop. If the reference voltage thereof can be varied as by changing over some of voltage-dividing resistors using a switch or the like, the amount of phase shift can be changed.

The operation of the circuit shown in FIG. 1 will be described next. The phase shifter 101 in FIG. 1 is provided in a PLL loop. On the assumption that the loop filter 103 is a lag-lead filter and that the phase lag falls within 90° ($\pi/2$), therefore, the amount of change in phase allowed in the phase shifter 101 is 90° ($\pi/2$) at most owing to the phase lag. The reason is that if the amount of change in phase in the phase shifter 101 were to exceed 90° ($\pi/2$) owing to phase lag, the negative feedback loop of the PLL could no longer be maintained, positive feedback and oscillation would occur and stable operation could no longer be achieved.

If this requirement is taken into consideration, the arrangement that is utilizable as the phase shifter 101 is limited to a first-order LPF comprising an RC bridge, etc. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the phase shifter 101, these two signals are utilized as signals of different phases.

What is noteworthy here is that although the phase of the reference frequency is changed, there is no change whatsoever in the frequency itself.

An XOR (exclusive-OR) gate is used as the phase comparator 102. The XOR gate is a digital circuit. The arrangement takes on the power-supply voltage VDD if the output amplitude is high, and takes on the ground voltage of 0 V if the output amplitude is low.

Accordingly, in a case where an XOR gate is used as the phase comparator 102 and the reference voltage applied to the non-inverting input terminal (+) of the differential amplifier 104 is one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage from one-half (½) the power-supply voltage VDD, then the phase difference produced between the two input signals of the phase comparator 102 can be made different from 90° ($\pi/2$). Accordingly, if the reference voltage can be varied as by changing over some voltage-dividing resistors using a switch or the like, then the amount of phase shift can be varied.

In view of the foregoing, the phase comparator 102 performs a linear operation, the reference voltage applied to the non-inverting input terminal of the differential amplifier 104 is VDD/2, and the phase difference produced between the two input signals of the phase comparator 102 is 90°. Therefore, if the set value of reference voltage has an error of 1%, the phase-shift error will be equivalent to 1.1°.

That is, if the reference voltage is varied by 1%, the phase shift can be varied by 1.1°.

FIRST EXAMPLE

Figure 2:
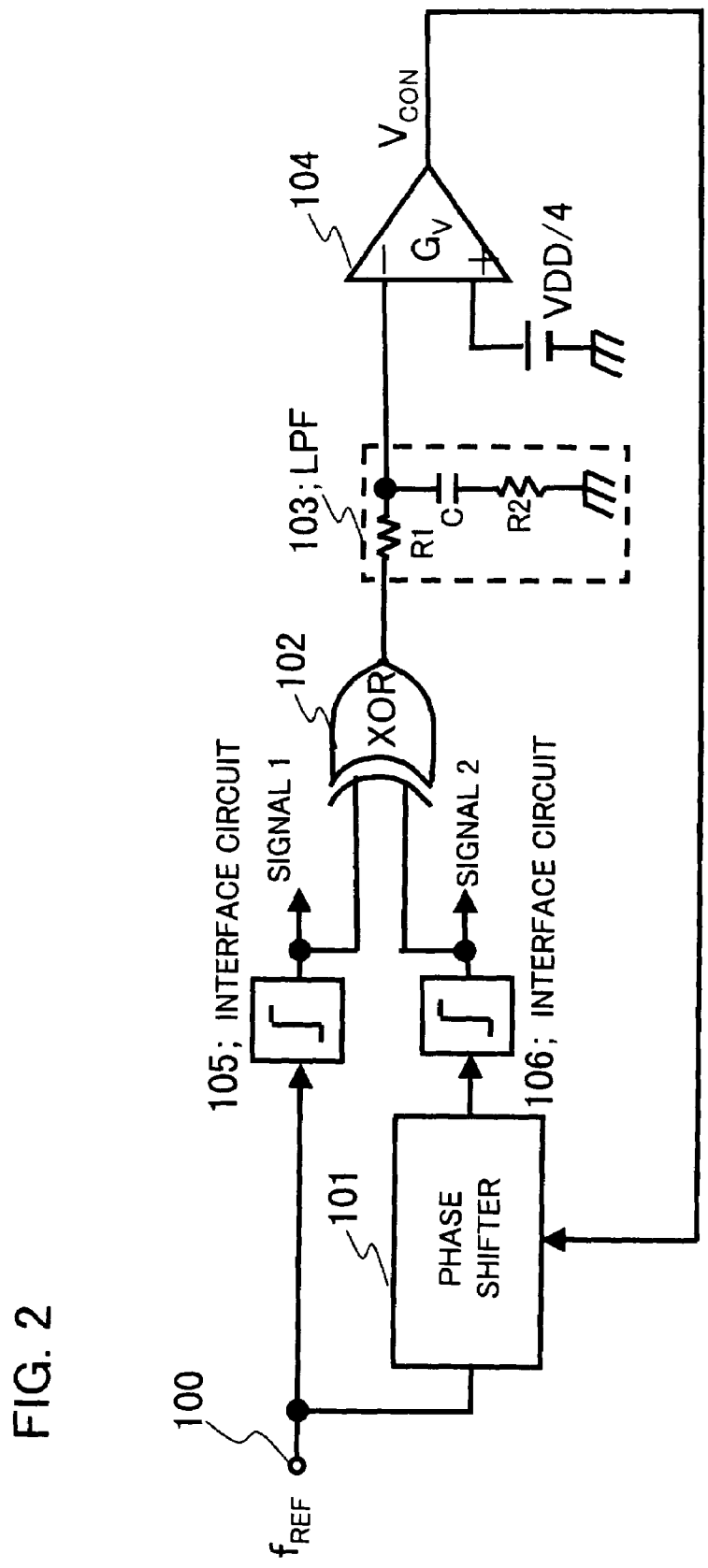
FIG. 2 is a diagram illustrating the configuration of a first example of the present invention.

FIG. 2 is a circuit diagram illustrating an example of the phase shifting circuit according to the present invention. In FIG. 2, the reference frequency $f_{REF}$ is supplied from the input terminal 100. The reference frequency $f_{REF}$ is wave-shaped into a rectangular waveform by an interface circuit 105 and becomes one input signal 1 to an XOR gate constituting the phase comparator 102. The frequency signal $f_{REF}$ is also subjected to a phase delay of 45° ($\pi/4$) and has its amplitude attenuated to $1/\sqrt{2}$ by the phase shifter 101, after which the signal is amplified and shaped into a rectangular waveform by an interface circuit 106. The resultant signal becomes another input signal 2 to the XOR gate constituting the phase comparator 102. Accordingly, the two input signals of the phase comparator 102 can be utilized as signals having a phase difference between them. The output signal of the XOR gate is a rectangular waveform having a duty of 1:3. If this signal is smoothened by the loop filter 103 comprising a lead-lag filter, a value of VDD/4 is obtained as a DC voltage. The lag-lead filter constructing the loop filter 103 comprises a resistor R1 a first end of which forms the filter input terminal and the second end of which forms the filter output terminal; and a resistor R2 and capacitor C serially connected between the second end of the resistor R1 and ground potential.

The DC voltage smoothened by the loop filter 103 is amplified by the differential amplifier 104 (the voltage gain of which is $-G_V$) to the non-inverting input terminal whereof the voltage of VDD/4 is applied as the reference voltage. The amplified voltage becomes the control voltage $V_{CON}$ of the phase shifter 101. That is, a PLL loop is constructed. Accordingly, by varying this reference voltage on the order of ±1% from VDD/4 by changing over voltage-dividing resistors using a switch or the like, the amount of phase shift can be varied on the order of ±1.1% (±0.01222$\pi$) from 45° ($\pi/4$).

Since the phase shifter 101 in FIG. 2 is provided in the PLL loop, the loop filter 103 is made a lag-lead type filter. If it is assumed that the phase lag falls within 90° ($\pi/2$), therefore, the amount of change in phase allowed in the phase shifter 101 is 90° ($\pi/2$) at most owing to the phase lag. If this were to be exceeded, the negative feedback loop of the PLL could no longer be maintained, positive feedback and oscillation would occur and stable operation could no longer be achieved.

If this requirement is taken into consideration, the arrangement that is utilizable as the phase shifter 101 is limited to a first-order LPF comprising an RC bridge, etc. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the phase shifter 101, these two signals are utilized as signals of different phases. It should be noted that the phase of the reference frequency is merely changed and that there is no change whatsoever in the frequency itself.

An XOR gate used as the phase comparator 102 is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° ($\pi/4$).

Accordingly, the phase shifter 101 is made one in which the phase lag increases when the control voltage $V_{CON}$ rises. For example, if the phase shifter 101 is made a first-order LPF comprising an RC bridge, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° ($\pi/4$) in the phase shifter 101 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

SECOND EXAMPLE

Figure 3:
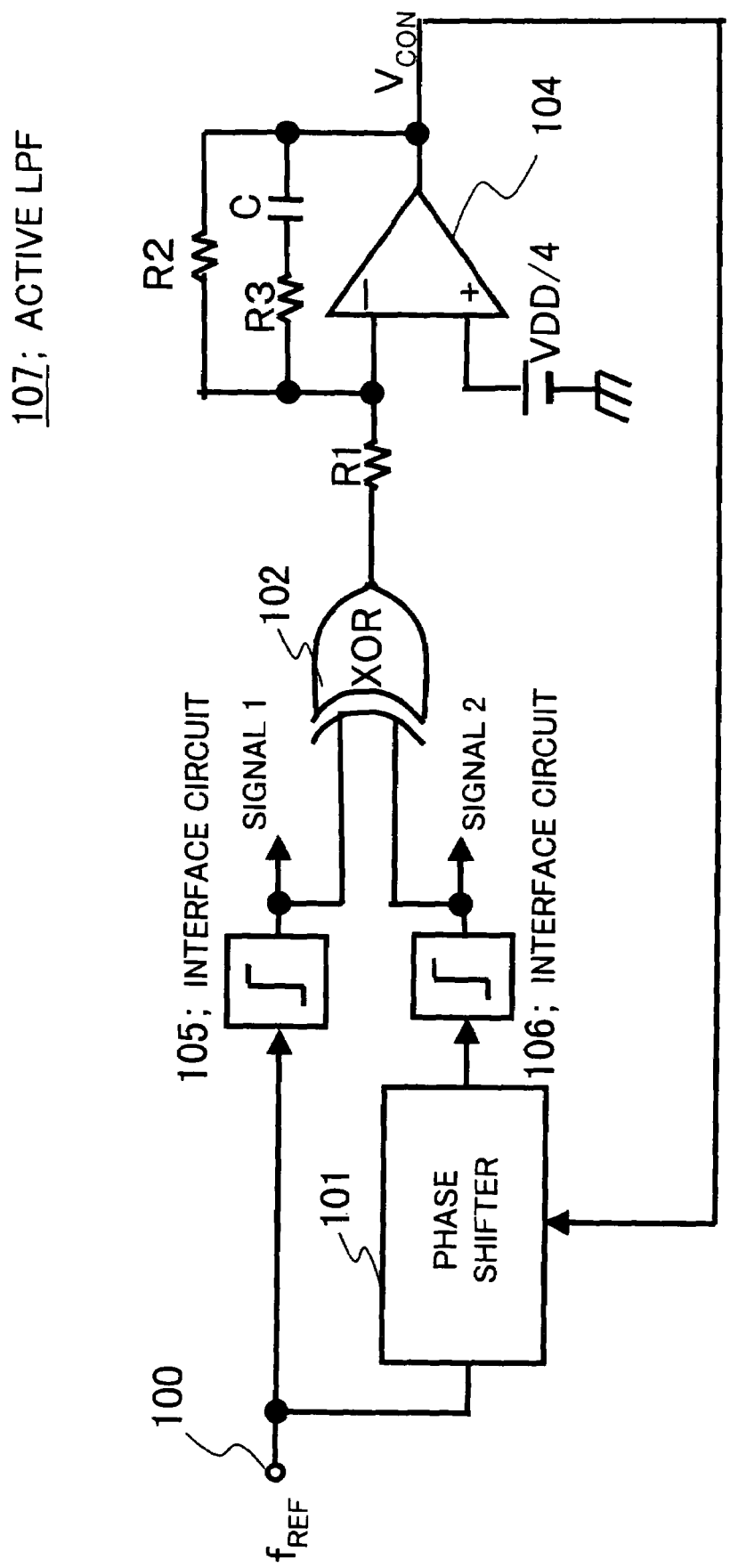
FIG. 3 is a diagram illustrating the configuration of a second example of the present invention.

The loop filter and differential amplifier may be combined, as illustrated in FIG. 3. As shown in FIG. 3, the reference frequency $f_{REF}$ is supplied from the input terminal 100. The reference frequency $f_{REF}$ is wave-shaped into a rectangular waveform by the interface circuit 105 and becomes one input signal 1 to the XOR gate constituting the phase comparator 102. The frequency signal $f_{REF}$ is also subjected to a phase delay of 45° ($\pi/4$) and has its amplitude attenuated to $1/\sqrt{2}$ by the phase shifter 101, after which the signal is amplified and wave-shaped into a rectangular waveform by the interface circuit 106. The resultant signal becomes another input signal 2 to the XOR gate constituting the phase comparator 102. Accordingly, the two input signals of the phase comparator 102 can be utilized as signals having a phase difference between them. The output signal of the XOR gate is a rectangular waveform having a duty of 1:3. If this signal is smoothened, a value that is one-fourth of the power-supply voltage VDD (namely VDD/4) is obtained as a DC voltage. This signal is supplied to a loop filter comprising an RC active filter 107 having a lag-lead filter characteristic and a voltage gain. The voltage of VDD/4 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal (−) of the differential amplifier 104 and the XOR gate, and the DC voltage gain $G_V$ is −R2/R1.

The signal is amplified with the voltage gain, high-frequency components are removed and the resultant signal becomes the control voltage of the phase shifter 101. That is, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 3 will be described. Since the phase shifter 101 in FIG. 3 is incorporated in the PLL loop, the loop filter 103 is made a lag-lead type filter. If it is assumed that the phase lag falls within 90° ($\pi/2$), therefore, the amount of change in phase allowed in the phase shifter 101 is 90° ($\pi/2$) at most owing to the phase lag. If the phase lag were to exceed 90° ($\pi/2$), the negative feedback loop of the PLL could no longer be maintained, positive feedback and oscillation would occur and stable operation could no longer be achieved.

If this requirement is taken into consideration, the arrangement that is utilizable as the phase shifter 101 is limited to a first-order LPF comprising an RC bridge, etc. On the assumption of utilization at high frequencies, the best arrangement is one in which a varactor capacitance whose capacitance value changes depending upon the applied voltage is used as the variable capacitor C. Since a phase difference is thus produced between the input reference frequency $f_{REF}$ and the output signal of the phase shifter 101, these two signals are utilized as signals of different phases. It should be noted that the phase of the reference frequency is merely changed and that there is no change whatsoever in the frequency itself. Further, an XOR gate used as the phase comparator 102 is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is VDD/2, namely one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° ($\pi/4$).

Accordingly, the phase shifter 101 is made one in which the phase lag increases when the control voltage $V_{CON}$ rises. For example, if the phase shifter 101 is made a first-order LPF comprising an RC bridge, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° ($\pi/4$) in the phase shifter 101 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some of the voltage-dividing resistors using a switch or the like, the amount of phase shift can be varied on the order to ±1.1%.

THIRD EXAMPLE

Figure 4:
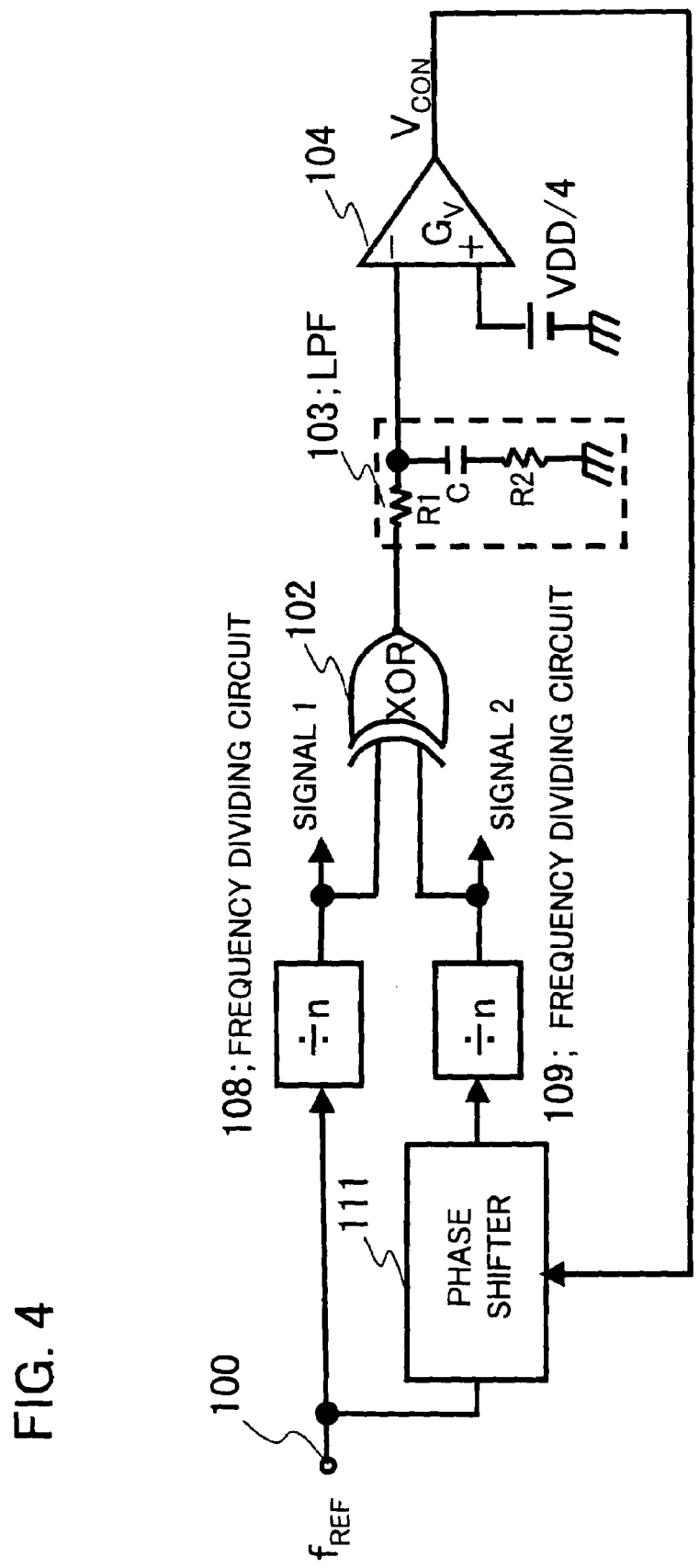
FIG. 4 is a diagram illustrating the configuration of a third example of the present invention.

As illustrated in FIG. 4, frequency dividing circuits 108 and 109 that divide frequency by the same number are inserted instead of the interfaces circuits 105 and 106 in front of respective ones of the input terminals of the phase comparator 102 employing the XOR gate in the circuit depicted in FIG. 2. This makes it possible to reduce the frequency input to the phase comparator 102.

As shown in FIG. 4, the reference frequency $f_{REF}$ is supplied from the input terminal 100. The reference frequency $f_{REF}$ becomes one input signal 1 to the XOR gate, which constitutes the phase comparator 102, upon being divided by the frequency dividing circuit 108, which divides by the number n. The frequency signal $f_{REF}$ is also subjected to a phase delay of 45° ($\pi/4$) and has its amplitude attenuated to $1/\sqrt{2}$ by the phase shifter 101, after which the signal is divided and shaped into a rectangular waveform by frequency dividing circuit 109, which divides by the number n. The resultant signal becomes another input signal 2 to the XOR gate constituting the phase comparator 102. Accordingly, the two input signals of the phase comparator 102 can be utilized as signals having a phase difference between them.

The dividing number n is set in such a manner that the output waveform of each of the frequency dividing circuits of dividing number n will be a rectangular waveform having a duty of 1:1 (a duty ratio of 50%). In this case, the output signal of the XOR gate constituting the phase comparator 102 becomes a rectangular signal having a duty of 1:3. If this signal is smoothened by the loop filter 103 comprising the lag-lead filter, a value of VDD/4 is obtained as the DC voltage. The output voltage of the loop filter 103 is amplified by the differential amplifier 104 (the voltage gain of which is $-G_V$) to which the voltage of VFF/4 is applied as the reference voltage, and the amplified signal becomes the control voltage of the phase shifter 101. Thus, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 4 will be described. Since the phase shifter 101 in FIG. 4 is incorporated in the PLL loop, the loop filter 103 is made a lag-lead type filter. If it is assumed that the phase lag falls within 90° ($\pi/2$), therefore, the amount of change in phase allowed in the phase shifter 101 is 90° ($\pi/2$) at most owing to the phase lag. If this were to be exceeded, the negative feedback loop of the PLL could no longer be maintained, positive feedback and oscillation would occur and stable operation could no longer be achieved. If this requirement is taken into consideration, the arrangement that is utilizable as the phase shifter 101 is limited to a first-order LPF comprising an RC bridge, etc. On the assumption of utilization at high frequencies, the best arrangement is one in which a varactor capacitance whose capacitance value changes depending upon the applied voltage is used as the variable capacitor C.

Since a phase difference is thus produced between the reference frequency $f_{REF}$ input to the input terminal 100 and the output signal of the phase shifter 101, these two signals are utilized as signals of different phases. It should be noted that the phase of the reference frequency $f_{REF}$ is merely changed and that there is no change whatsoever in the frequency itself.

Further, an XOR gate constituting the phase comparator 102 is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° (π/4). Accordingly, the phase shifter 101 is made one in which the phase lag increases when the control voltage $V_{CON}$ rises. For example, if the phase shifter 101 is made a first-order LPF comprising an RC bridge, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° (π/4) in the phase shifter 101 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

FOURTH EXAMPLE

Figure 5:
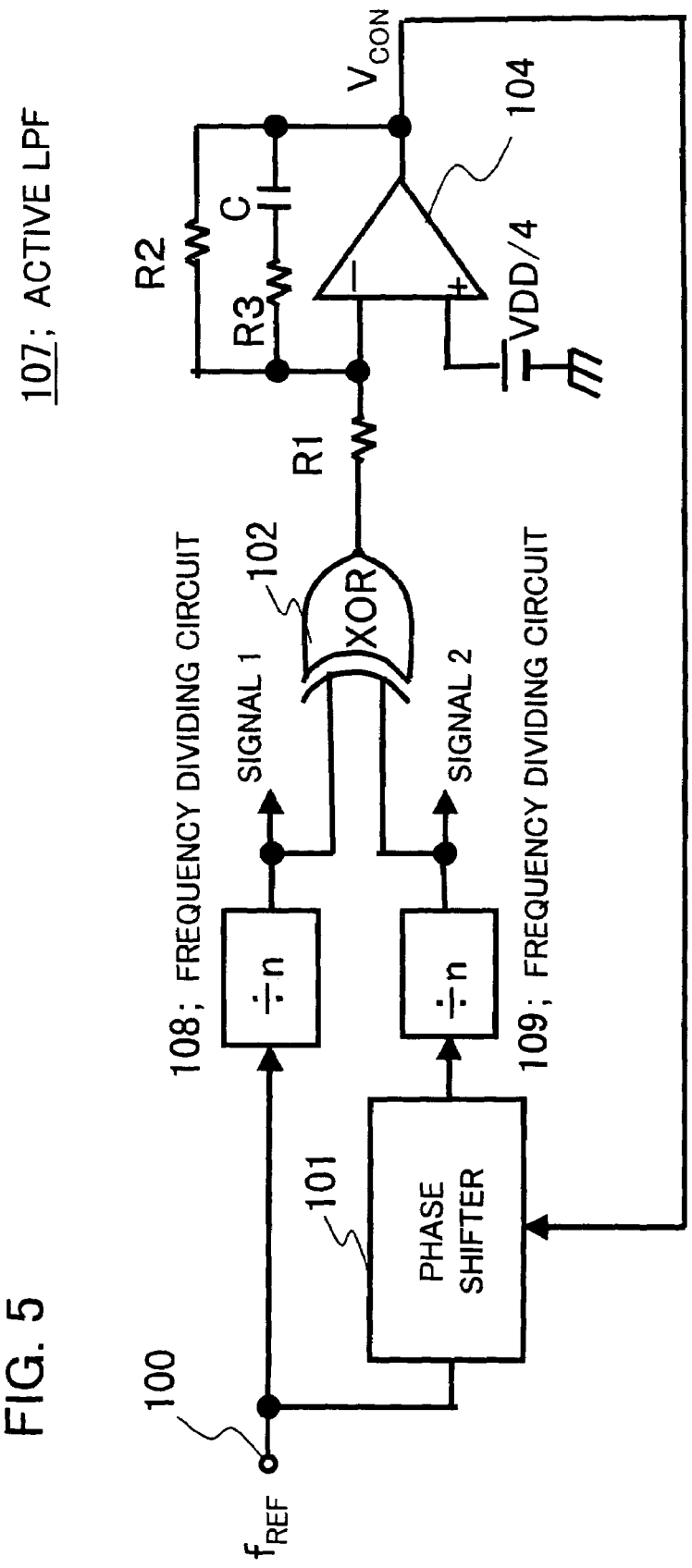
FIG. 5 is a diagram illustrating the configuration of a fourth example of the present invention.

FIG. 5 is a diagram illustrating the configuration of a fourth example of the present invention. As illustrated in FIG. 5, the frequency dividing circuits 108 and 109 that divide frequency by the same number are inserted instead of the interfaces circuits 105, 106 in front of respective ones of the input terminals of the phase comparator 102 employing the XOR gate in the circuit depicted in FIG. 3. This makes it possible to reduce the frequency input to the phase comparator 102. That is, the RC active filter (active LPF) 107, which is obtained by combining the loop filter and differential amplifier, can be used.

As shown in FIG. 5, the reference frequency $f_{REF}$ is supplied from the input terminal 100. The reference frequency $f_{REF}$ becomes one input signal 1 to the XOR gate, which constitutes the phase comparator 102, upon being divided by the frequency dividing circuit 108, which divides by the number n. The frequency signal $f_{REF}$ is also subjected to a phase delay of 45° (π/4) and has its amplitude attenuated to $1/\sqrt{2}$ by the phase shifter 101, after which the signal is divided and shaped into a rectangular waveform by frequency dividing circuit 109, which divides by the number n. The resultant signal becomes another input signal 2 to the XOR gate constituting the phase comparator 102. Accordingly, the two input signals of the phase comparator 102 can be utilized as signals having a phase difference between them.

The dividing number n is set in such a manner that the output waveform of each of the frequency dividing circuits 108 and 109 of dividing number n will be a rectangular waveform having a duty of 1:1 (a duty ratio of 50%). In this case, the output signal of the XOR gate constituting the phase comparator 102 becomes a rectangular signal having a duty of 1:3. If this signal is smoothened, a value of VDD/4, which is one-fourth of the power-supply voltage VDD, is obtained as the DC voltage. This signal is supplied to the loop filter comprising the RC active filter 107 having the lag-lead filter character characteristic and a voltage gain. The voltage of VDD/4 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal of the differential amplifier 104 and the output of the XOR gate, and the DC voltage gain $G_V$ is −R2/R1. The signal is amplified with the voltage gain, high-frequency components are removed and the resultant signal becomes the control voltage of the phase shifter 101. That is, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 5 will be described. Since the phase shifter 101 in FIG. 5 is incorporated in the PLL loop, the loop filter 103 is made a lag-lead type filter. If it is assumed that the phase lag falls within 90° (π/2), therefore, the amount of change in phase allowed in the phase shifter 101 is 90° (π/2) at most owing to the phase lag. If the phase lag were to exceed 90° (π/2), the negative feedback loop of the PLL could no longer be maintained, positive feedback and oscillation would occur and stable operation could no longer be achieved. If this requirement is taken into consideration, the arrangement that is utilizable as the phase shifter 101 is limited to a first-order LPF comprising an RC bridge. On the assumption of utilization at high frequencies, the best arrangement is one in which a varactor capacitance whose capacitance value changes depending upon the applied voltage is used as the variable capacitor C. Since a phase difference is thus produced between the input reference frequency $f_{REF}$ and the output signal of the phase shifter 101, these two signals are utilized as signals of different phases. It should be noted that the phase of the reference frequency is merely changed and that there is no change whatsoever in the frequency itself.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is VDD/2, namely one-half the power-supply voltage VDD, the phase difference of 90° (π/2) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° (π/4).

Accordingly, the phase shifter 101 is made one in which the phase lag increases when the control voltage $V_{CON}$ rises. For example, if the phase shifter 101 is made a first-order LPF comprising an RC bridge, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° (π/4) in the phase shifter 101 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

FIFTH EXAMPLE

A method of constructing a π/2 (90°) phase shifting circuit will be described next. It is necessary to construct a negative feedback loop in order to form and control a PLL loop. However, in an arrangement in which a phase shifter formed from a first-order LPF is simply changed to a second-order LPF, phase rotates from 0° to 180° in the second-order LPF and phase rotates further in similar fashion also in the loop filter (first-order LPF). In actuality, therefore, a negative feedback loop cannot be constructed.

Since a loop filter (first-order LPF) is essential in a PLL circuit, the phase shifter incorporated in the PLL loop is limited to a first-order LPF.

Accordingly, a second-order LPF is branched into two first-order LPFs, one is placed inside the PLL loop and one is placed outside the PLL loop.

However, the two first-order LPFs are made identical, the same control voltage $V_{CON}$ is applied thereto and it can be expected that the amounts of phase shift at this time will be identical.

Figure 6:
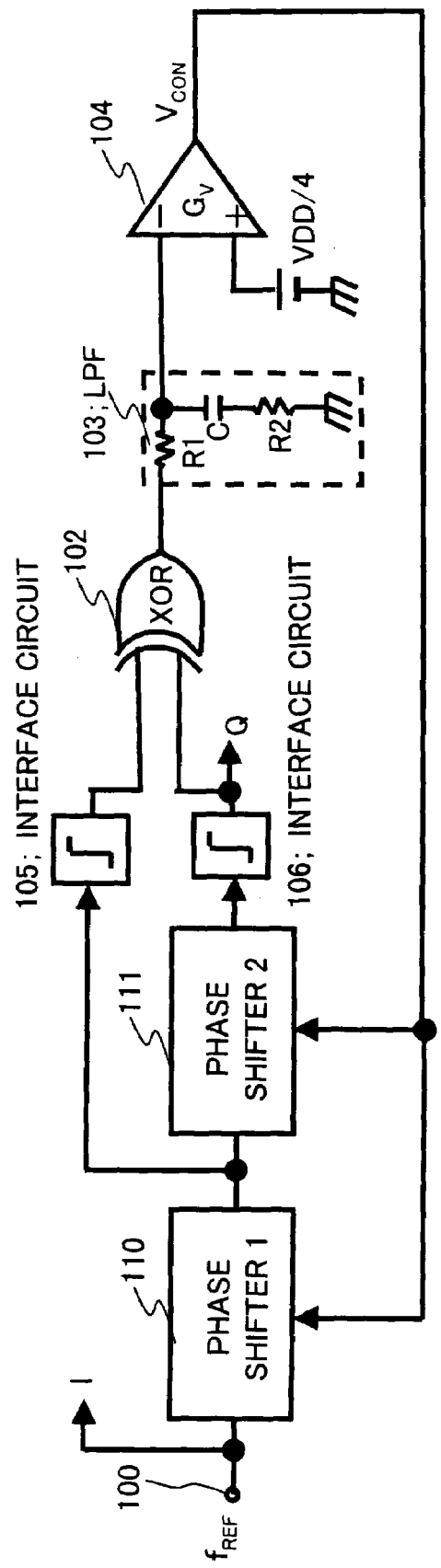
FIG. 6 is a diagram illustrating the configuration of a fifth example of the present invention.

In FIG. 6, the reference frequency $f_{REF}$ is supplied from the input terminal 100. The reference frequency $f_{REF}$ is subjected to a phase delay of 45° (π/4) and has its amplitude attenuated to $1/\sqrt{2}$ by a first phase shifter 110. The signal is then branched. That is, one of the branched signals has its amplitude amplified and is wave-shaped into a rectangular waveform by the interface circuit 105. The resultant signal becomes one signal to the XOR gate constituting the phase comparator 102. The other branched signal is subjected to a phase delay of 45° (π/4) and has its amplitude attenuated to $1/\sqrt{2}$ by a second phase shifter 111, after which the signal is amplified and shaped into a rectangular waveform by the interface circuit 106. The resultant signal becomes another input signal to the XOR gate constituting the phase comparator 102. Here the first phase shifter 110 and second phase shifter 111 are controlled in common by the control voltage $V_{CON}$. Accordingly, the amounts of phase shift by the first phase shifter 110 and second phase shifter 111 are approximately equal. As a result, the sum total of the amounts of phase shift by these two phase shifters is 90° (π/2). Accordingly, the reference frequency and one input signal to the phase comparator 102 can be utilized as signals having a phase difference between them.

The output signal of the XOR gate is a rectangular waveform having a duty of 1:3. If this signal is smoothened by the loop filter 103 comprising a lead-lag filter, a value of VDD/4 is obtained as a DC voltage. The output voltage of the loop filter 103 is amplified by the differential amplifier 104 (the voltage gain of which is $-G_V$) to which the voltage of VDD/4 is applied as the reference voltage. The amplified voltage becomes the control voltage $V_{CON}$ of the first and second phase shifters 110 and 111. That is, a PLL loop is constructed. Accordingly, if this reference voltage is varied as by changing over some of the voltage-dividing resistors using a switch or the like, the amount of phase shift can be varied.

The operation of the circuit shown in FIG. 6 will be described. As shown in FIG. 6, the first phase shifter 110 is placed outside the PLL loop and the second phase shifter 111 is incorporated in the PLL loop. Therefore the loop filter 103 is made a lag-lead type filter. If it is assumed that the phase lag falls within 90° (π/2), therefore, the amount of change in phase allowed in the second phase shifter 111 is 90° (π/2) at most owing to the phase lag. If the phase lag were to exceed 90° (π/2), the negative feedback loop of the PLL could no longer be maintained, positive feedback and oscillation would occur and stable operation could no longer be achieved. If this requirement is taken into consideration, the arrangement that is utilizable as the phase shifter is limited to a first-order LPF comprising an RC bridge, etc., in a case where the first phase shifter 110 and second phase shifter 111 are identical. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the second phase shifter 111, these two signals are utilized as signals of different phases. It should be noted that the phase of the reference frequency is merely changed and that there is no change whatsoever in the frequency itself. Further, an XOR gate is used as the phase comparator 102. The XOR gate is a digital circuit. The arrangement takes on the power-supply voltage VDD if the output amplitude is high, and takes on the ground voltage of 0 V if the output amplitude is low.

Accordingly, in a case where an XOR gate is used as the phase comparator 102 and the reference voltage at the non-inverting input terminal of the differential amplifier 104 is one-half (½) the power-supply voltage VDD, the phase difference of 90° (π/2) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° (π/4).

Accordingly, the first phase shifter 110 and second phase shifter 111 are both made phase shifters in which the phase lag increases when the control voltage $V_{CON}$ rises. For example, if the two phase shifters 110 and 111 are each made RC-bridge first-order LPFs, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° (π/4) in each of the phase shifters 110 and 111 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1° Other phase error that arises is ascribable to matching between the first phase shifter 110 and second phase shifter 111. Accordingly, if the reference voltage is varied on the order of ±1% as by changing over some voltage-dividing resistors using a switch or the like, then the amount of phase shift can be varied on the order to ±2.2%.

SIXTH EXAMPLE

Figure 7:
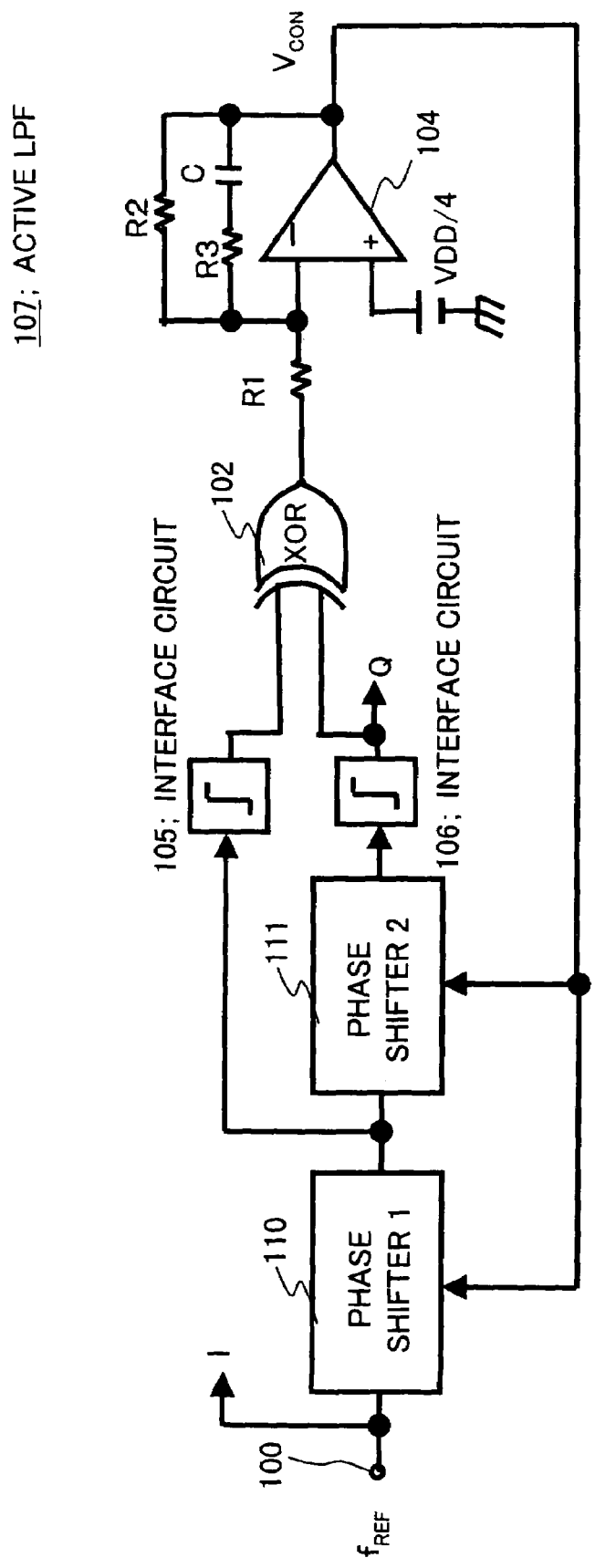
FIG. 7 is a diagram illustrating the configuration of a sixth example of the present invention.

FIG. 7 is a diagram illustrating the configuration of a sixth example of the present invention. As illustrated in FIG. 7, this example is obtained by combining the loop filter and differential amplifier of FIG. 6. In FIG. 7, the reference frequency $f_{REF}$ is supplied from the input terminal 100. The reference frequency $f_{REF}$ is subjected to a phase delay of 45° ($\pi/4$) and has its amplitude attenuated to $1/\sqrt{2}$ by the first phase shifter 110. The signal is then branched. That is, one of the branched signals has its amplitude amplified and is wave-shaped into a rectangular waveform by the interface circuit 105. The resultant signal becomes one signal to the XOR gate constituting the phase comparator 102. The other branched signal is subjected to a phase delay of 45° ($\pi/4$) and has its amplitude attenuated to $1/\sqrt{2}$ by the second phase shifter 111, after which the signal is amplified and shaped into a rectangular waveform by the interface circuit 106. The resultant signal becomes another input signal to the XOR gate constituting the phase comparator 102. Here the first phase shifter 110 and second phase shifter 111 are controlled in common by the control voltage $V_{CON}$. Accordingly, the amounts of phase shift by the first phase shifter 110 and second phase shifter 111 are approximately equal. As a result, the sum total of the amounts of phase shift by these two phase shifters is 90° ($\pi/2$). Accordingly, the reference frequency and one input signal to the phase comparator 102 can be utilized as signals having a phase difference between them.

The output signal of the XOR gate is a rectangular waveform having a duty of 1:3. If this signal is smoothened, a value of VDD/4 is obtained as a DC voltage. This signal is supplied to the loop filter comprising the RC active filter 107 having a lag-lead filter characteristic and a voltage gain. The voltage of VDD/4 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal of the differential amplifier 104 and the output of the XOR gate, and the DC voltage gain $G_V$ is −R2/R1. The signal is amplified with the voltage gain, high-frequency components are removed and the resultant signal becomes the common control voltage of the first phase shifter 110 and second phase shifter 111. That is, a PLL loop is constructed by the circuit blocks with the exception of the first phase shifter 110. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 6 will be described. As shown in FIG. 7, the first phase shifter 110 is placed outside the PLL loop and the second phase shifter 111 is incorporated in the PLL loop. Therefore the loop filter 103 is made a lag-lead type filter. If it is assumed that the phase lag falls within 90° ($\pi/2$), therefore, the amount of change in phase allowed in the second phase shifter 111 is 90° ($\pi/2$) at most owing to the phase lag. If this were to be exceeded, the negative feedback loop of the PLL could no longer be maintained, positive feedback and oscillation would occur and stable operation could no longer be achieved. If this requirement is taken into consideration, the arrangement that is utilizable as the phase shifter is limited to a first-order LPF comprising an RC bridge, etc. If this requirement is taken into consideration, the arrangement that is utilizable as the phase shifter is limited to a first-order LPF comprising an RC bridge, etc., in a case where the first phase shifter 110 and second phase shifter 111 are identical. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the second phase shifter 111, these two signals are utilized as signals of different phases. It should be noted that the phase of the reference frequency is merely changed and that there is no change whatsoever in the frequency itself.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low.

Accordingly, in a case where an XOR gate is used as the phase comparator 102 and the reference voltage at the non-inverting input terminal of the differential amplifier 104 is one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° ($\pi/4$).

Accordingly, the first phase shifter 110 and second phase shifter 111 are both made phase shifters in which the phase lag increases when the control voltage $V_{CON}$ rises. For example, if the two phase shifters 110 and 111 are each made RC-bridge first-order LPFs, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° ($\pi/4$) in each of the phase shifters 110 and 111 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Other phase error that arises is ascribable to matching between the first phase shifter 110 and second phase shifter 111. Accordingly, if the reference voltage is varied on the order of ±1% as by changing over some of the voltage-dividing resistors using a switch or the like, then the amount of phase shift can be varied on the order to ±2.2%.

SEVENTH EXAMPLE

Figure 8:
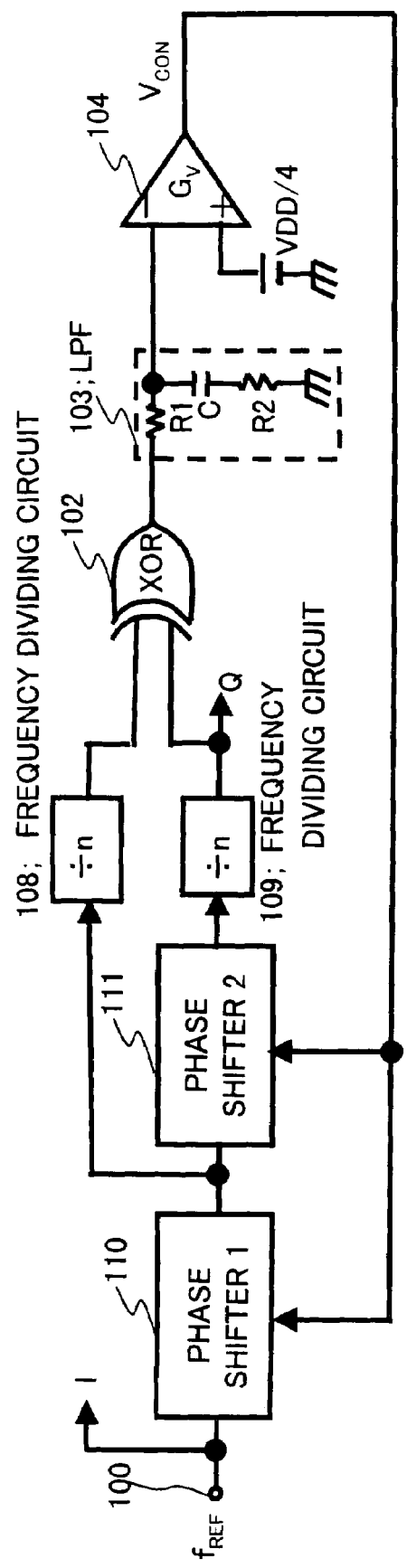
FIG. 8 is a diagram illustrating the configuration of a seventh example of the present invention.

FIG. 8 is a diagram illustrating the configuration of a seventh example of the present invention. As illustrated in FIG. 8, the frequency dividing circuits 108 and 109 that divide frequency by the same number are inserted instead of the interfaces circuits 105 and 106 in front of respective ones of the input terminals of the phase comparator 102 employing the XOR gate in the circuit depicted in FIG. 6. This makes it possible to reduce the frequency input to the phase comparator 102.

In FIG. 8, the reference frequency $f_{REF}$ is supplied from the input terminal 100. The reference frequency $f_{REF}$ is subjected to a phase delay of 45° ($\pi/4$) and has its amplitude attenuated to $1/\sqrt{2}$ by the first phase shifter 110. The signal is then branched. That is, one of the branched signals becomes one input signal to the XOR gate, which constitutes the phase comparator 102, upon being divided by the frequency dividing circuit 108, which divides by the number n. The other branched signal is subjected to a phase delay of 45° ($\pi/4$) and has its amplitude attenuated to $1/\sqrt{2}$ by the second phase shifter 111, after which the signal is divided and shaped into a rectangular waveform by frequency dividing circuit 109, which divides by the number n. The resultant signal becomes another input signal to the XOR gate constituting the phase comparator 102. Here the first phase shifter 110 and second phase shifter 111 are controlled in common by the control voltage $V_{CON}$. Accordingly, the amounts of phase shift by the first phase shifter 110 and second phase shifter 111 are approximately equal. As a result, the sum total of the amounts of phase shift by these two phase shifters is 90° ($\pi/2$). Accordingly, the reference frequency and one input signal to the phase comparator 102 can be utilized as signals having a phase difference between them.

The output signal of the XOR gate becomes a rectangular signal having a duty of 1:3. If this signal is smoothened by the loop filter 103 comprising the lag-lead filter, a value of VDD/4 is obtained as the DC voltage. The output voltage of the loop filter 103 is amplified by the differential amplifier 104 (the voltage gain of which is $-G_V$) to which the voltage of VDD/4 is applied as the reference voltage, and the amplified signal becomes the control voltage of the first and second phase shifters 110 and 111. Thus, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 8 will be described. As shown in FIG. 8, the first phase shifter 110 is placed outside the PLL loop and the second phase shifter 111 is incorporated in the PLL loop. Therefore the loop filter 103 is made a lag-lead type filter. If it is assumed that the phase lag falls within 90° ($\pi/2$), therefore, the amount of change in phase allowed in the second phase shifter 111 is 90° ($\pi/2$) at most owing to the phase lag. If this were to be exceeded, the negative feedback loop of the PLL could no longer be maintained, positive feedback and oscillation would occur and stable operation could no longer be achieved. If this requirement is taken into consideration, the arrangement that is utilizable as the phase shifter is limited to a first-order LPF comprising an RC bridge, etc., in a case where the first phase shifter 110 and second phase shifter 111 are identical. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the second phase shifter 111, these two signals are utilized as signals of different phases. It should be noted that the phase of the reference frequency is merely changed and that there is no change whatsoever in the frequency itself.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage at the non-inverting input terminal of the differential amplifier 104 is one-half (½) the power-supply voltage VDD, the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° ($\pi/4$).

Accordingly, the first phase shifter 110 and second phase shifter 111 are both made phase shifters in which the phase lag increases when the control voltage $V_{CON}$ rises. For example, if the two phase shifters 110 and 111 are each made RC-bridge first-order LPFs, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° ($\pi/4$) in each of the phase shifters 110 and 111 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Other phase error that arises is ascribable to matching between the first phase shifter 110 and second phase shifter 111. Accordingly, if the reference voltage is varied on the order of ±1% as by changing over some voltage-dividing resistors using a switch or the like, then the amount of phase shift can be varied on the order to ±2.2%.

EIGHTH EXAMPLE

Figure 9:
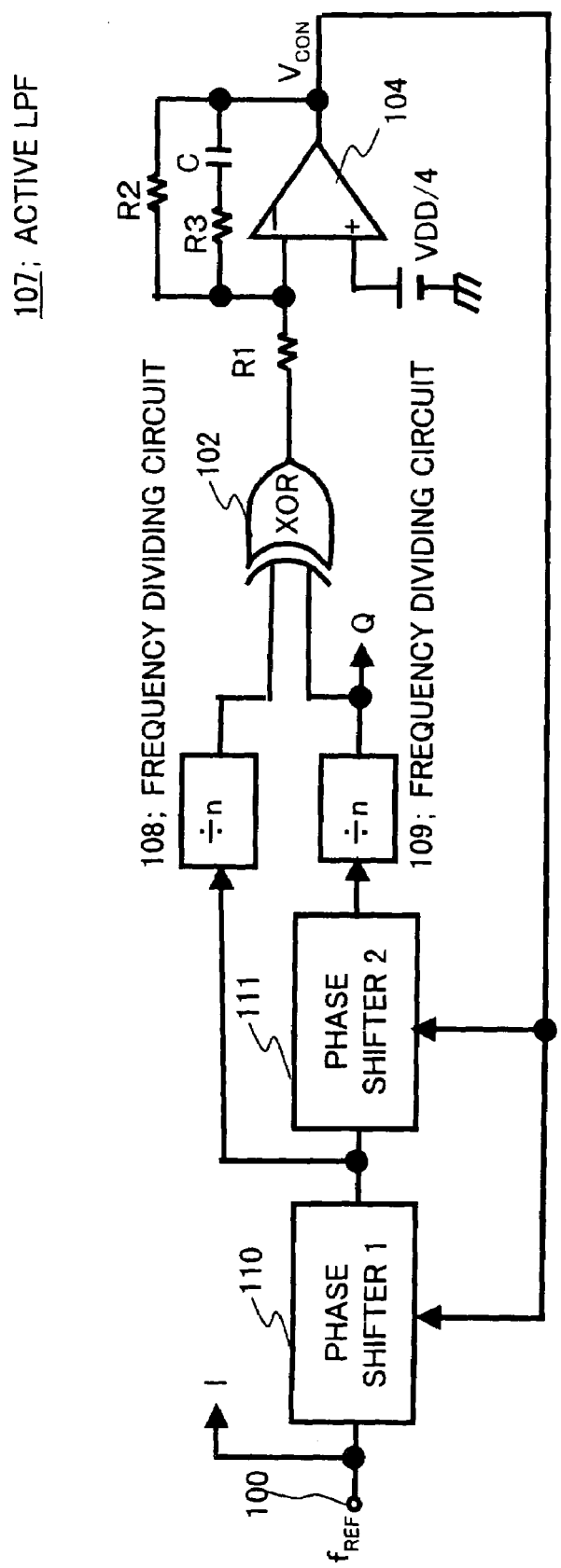
FIG. 9 is a diagram illustrating the configuration of an eighth example of the present invention.

FIG. 9 is a diagram illustrating the configuration of an eighth example of the present invention. As illustrated in FIG. 9, this example is obtained by combining the loop filter and differential amplifier of FIG. 8.

In FIG. 9, the reference frequency $f_{REF}$ is supplied from the input terminal 100. The reference frequency $f_{REF}$ is subjected to a phase delay of 45° ($\pi/4$) and has its amplitude attenuated to $1/\sqrt{2}$ by the first phase shifter 110. The signal is then branched. That is, one of the branched signals becomes one input signal to the XOR gate, which constitutes the phase comparator 102, upon being divided by the frequency dividing circuit 108, which divides by the number n. The other branched signal is subjected to a phase delay of 45° ($\pi/4$) and has its amplitude attenuated to $1/\sqrt{2}$ by the second phase shifter 111, after which the signal is divided and shaped into a rectangular waveform by frequency dividing circuit 109, which divides by the number n. The resultant signal becomes another input signal to the XOR gate constituting the phase comparator 102. Here the first phase shifter 110 and second phase shifter 111 are controlled in common by the control voltage $V_{CON}$.

Accordingly, the amounts of phase shift by the first phase shifter 110 and second phase shifter 111 are approximately equal. As a result, the sum total of the amounts of phase shift by these two phase shifters is 90° ($\pi/2$). Accordingly, the reference frequency and one input signal to the phase comparator 102 can be utilized as signals having a phase difference between them.

The output signal of the XOR gate becomes a rectangular signal having a duty of 1:3. If this signal is smoothened, a value of VDD/4 is obtained as the DC voltage. This signal is supplied to the loop filter comprising the RC active filter 107 having the lag-lead filter character characteristic and a voltage gain. The voltage of VDD/4 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal of the differential amplifier 104 and the output of the XOR gate, and the DC voltage gain $G_V$ is −R2/R1. The signal is amplified with the voltage gain $G_V$, high-frequency components are removed and the resultant signal becomes the common control voltage of the first phase shifter 110 and second phase shifter 111.

That is, a PLL loop is constructed by the circuit blocks with the exception of the first phase shifter 110. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 9 will be described. As shown in FIG. 9, the first phase shifter 110 is placed outside the PLL loop and the second phase shifter 111 is incorporated in the PLL loop. Therefore the loop filter 103 is made a lag-lead type filter. If it is assumed that the phase lag falls within 90° ($\pi/2$), therefore, the amount of change in phase allowed in the second phase shifter 111 is 90° ($\pi/2$) at most owing to the phase lag. If the phase lag were to exceed 90° ($\pi/2$), the negative feedback loop of the PLL could no longer be maintained, positive feedback and oscillation would occur and stable operation could no longer be achieved. If this requirement is taken into consideration, the arrangement that is utilizable as the phase shifter is limited to a first-order LPF comprising an RC bridge, etc. If this requirement is taken into consideration, the arrangement that is utilizable as the phase shifter is limited to a first-order LPF comprising an RC bridge, etc. On the assumption of utilization at high frequencies, the best arrangement is one in which a varactor capacitance whose capacitance value changes depending upon the applied voltage is used as the variable capacitor C.

Since a phase difference is thus produced between the input reference frequency $f_{REF}$ and the output signal of the second phase shifter 111, these two signals are utilized as signals of different phases. It should be noted that the phase of the reference frequency is merely changed and that there is no change whatsoever in the frequency itself.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage at the non-inverting input terminal of the differential amplifier 104 is one-half (½) the power-supply voltage VDD (namely VDD/2), the phase difference of 90° ($\pi/2$) is produced between the two input signals of the phase comparator 102 if the PLL loop is pulled in and locks. However, if the PLL loop is pulled in and locked by changing the reference voltage to one-fourth of the power-supply voltage VDD (namely to VDD/4), then the phase difference produced between the two input signals of the phase comparator 102 can be set to 45° ($\pi/4$).

Accordingly, the first phase shifter 110 and second phase shifter 111 are both made phase shifters in which the phase lag increases when the control voltage $V_{CON}$ rises. For example, if the two phase shifters 110 and 111 are each made RC-bridge first-order LPFs, the capacitor C uses a varactor the capacitance value of which can be can be enlarged by applying a voltage across the electrodes and the capacitance value increases monotonously with respect to an increase in the voltage applied across the electrodes, then the point at which the phase difference becomes 45° ($\pi/4$) in each of the phase shifters 110 and 111 comprising the RC-bridge first-order LPF will be the 3-dB cutoff frequency of the first-order LPF and the amount of change in phase versus a change in frequency in the vicinity of this point will be large. That is, if the region is one having a large slope and the phase comparator 102 operates linearly, the phase difference will be 90° at a reference voltage of VDD/2. Therefore, if the set value of reference voltage has an error of 1%, the phase error will correspond to 1.1°. Other phase error that arises is ascribable to matching between the first phase shifter 110 and second phase shifter 111. Accordingly, if the reference voltage is varied on the order of ±1% as by changing over some voltage-dividing resistors using a switch or the like, then the amount of phase shift can be varied on the order to ±2.2%.

NINTH EXAMPLE

Figure 10:
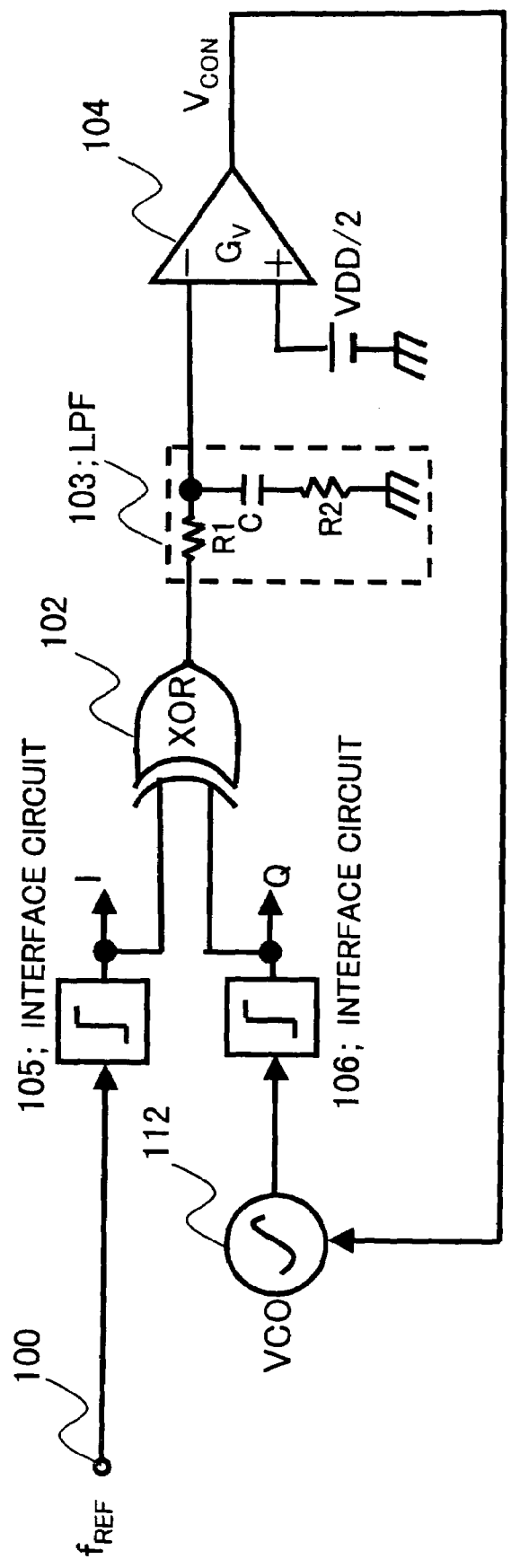
FIG. 10 is a diagram illustrating the configuration of a ninth example of the present invention.

As illustrated in FIG. 10, a 90° ($\pi/2$) phase shifting circuit can be implemented also by using a well-known PLL circuit that employs a voltage-controlled oscillator (VCO).

As shown in FIG. 10, the reference frequency $f_{REF}$ is supplied from the input terminal 100. The reference frequency $f_{REF}$ is wave-shaped into a rectangular waveform by the interface circuit 105 and becomes one input signal to the XOR gate constituting the phase comparator 102. A VCO 112 supplies oscillation frequency. This signal is wave-shaped into a rectangular signal by the interface circuit 106 and becomes another input signal to the XOR gate constituting the phase comparator 102. Accordingly, the two input signals of the phase comparator 102 can be utilized as signals having a phase difference between them.

The output signal of the XOR gate is a rectangular waveform having a duty of 1:1. If this signal is smoothened by the loop filter 103 comprising a lead-lag filter, a value of VDD/2 is obtained as a DC voltage. The output voltage of the loop filter 103 is amplified by the differential amplifier 104 (the voltage gain of which is −$G_V$) to which the voltage of VDD/2 is applied as the reference voltage. The amplified voltage becomes the control voltage $V_{CON}$ of the VCO 112. That is, a PLL loop is constructed. Accordingly, if this reference voltage is varied as by changing over some of the voltage-dividing resistors using a switch or the like, the amount of phase shift can be varied.

The operation of the circuit shown in FIG. 10 will be described. The VCO 112, phase comparator 102 and loop filter (lag-lead-type filter) 103 construct a PLL circuit. On the assumption of utilization at high frequencies, the best arrangement is one in which an LC tank circuit is used as the tank circuit of the VCO 112 and a varactor capacitance whose capacitance value changes depending upon the applied voltage is used as the variable capacitor C.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is VDD/2, namely one-half the power-supply voltage VDD, the phase difference of 90° ($\pi/2$) is produced between the two input signals of the phase comparator 102 if the PLL loop is pulled in and locks. Since a phase difference is thus produced between the entered reference frequency and the output signal of the VCO 112, these two signals are utilized as signals having a phase difference between them.

Here the VCO 112 is made one whose oscillation frequency declines when the control voltage $V_{CON}$ rises. For example, it will suffice if the VCO 112 is made one having a tuning circuit comprising an LC tank circuit, the capacitor C uses a varactor the capacitance value of which can be can be enlarged by applying a voltage across the electrodes, and the capacitance value increases monotonously with respect to an increase in the voltage applied across the electrodes.

If the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

TENTH EXAMPLE

Figure 11:
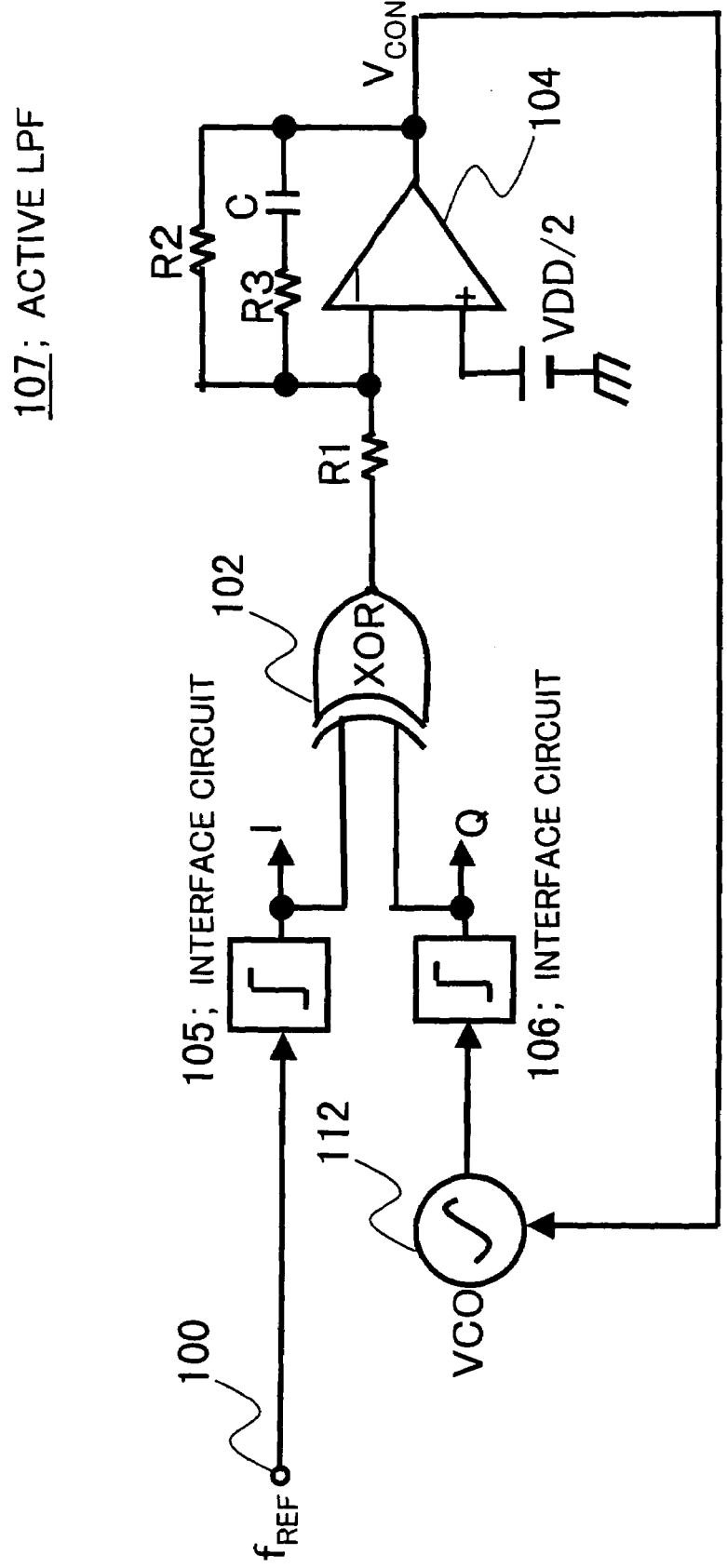
FIG. 11 is a diagram illustrating the configuration of a tenth example of the present invention.

FIG. 11 is a diagram illustrating the configuration of a tenth example of the present invention. In this example, the loop filter and differential amplifier of FIG. 10 can be combined, as illustrated in FIG. 11.

As shown in FIG. 11, the reference frequency $f_{REF}$ is supplied from the input terminal 100. The reference frequency $f_{REF}$ is wave-shaped into a rectangular waveform by the interface circuit 105 and becomes one input signal to the XOR gate constituting the phase comparator 102. The VCO 112 supplies oscillation frequency. This signal has its amplitude amplified and is wave-shaped into a rectangular signal by the interface circuit 106 and becomes another input signal to the XOR gate constituting the phase comparator 102. Accordingly, the two input signals of the phase comparator 102 can be utilized as signals having a phase difference between them.

The output signal of the XOR gate is a rectangular waveform having a duty of 1:1. If this signal is smoothened, a value of VDD/2 is obtained as a DC voltage. This signal is supplied to a loop filter comprising an RC active filter 107 having a lag-lead filter characteristic and a voltage gain. The voltage of VDD/2 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal of the differential amplifier 104 and the output of the XOR gate, and the DC voltage gain $G_V$ is −R2/R1. The signal is amplified with the voltage gain $G_V$, high-frequency components are removed and the resultant signal becomes the control voltage of the VCO (phase shifter) 112. That is, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 11 will be described. The VCO 112, phase comparator 102 and loop filter (lag-lead-type filter) comprising the RC active filter 107 construct a PLL circuit in FIG. 11. On the assumption of utilization at high frequencies, the best arrangement is one in which a varactor capacitance whose capacitance value changes depending upon the applied voltage is used as the variable capacitor C.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is VDD/2, namely one-half the power-supply voltage VDD, the phase difference of 90° (π/2) is produced between the two input signals of the phase comparator 102 if the PLL loop is pulled in and locks. Since a phase difference is thus produced between the entered reference frequency and the output signal of the VCO 112, these two signals are utilized as signals having a phase difference between them.

Here the VCO 112 is made one whose oscillation frequency declines when the control voltage $V_{CON}$ rises. For example, it will suffice if the VCO 112 is made one having a tuning circuit comprising an LC tank circuit, the capacitor C uses a varactor the capacitance value of which can be can be enlarged by applying a voltage across the electrodes, and the capacitance value increases monotonously with respect to an increase in the voltage applied across the electrodes.

If the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some of the voltage-dividing resistors using a switch or the like, the amount of phase shift can be varied on the order to ±1.1%.

11$^{TH}$ EXAMPLE

Figure 12:
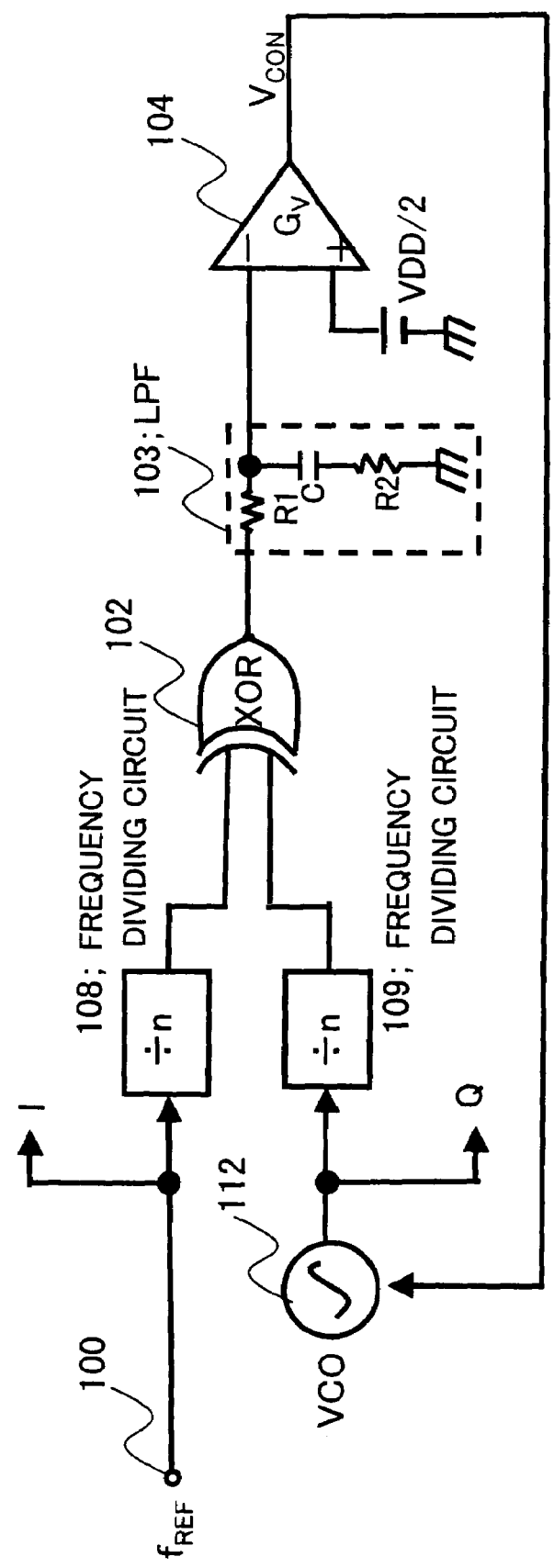
FIG. 12 is a diagram illustrating the configuration of an 11th example of the present invention.

FIG. 12 is a diagram illustrating the configuration of a tenth example of the present invention. As illustrated in FIG. 12, in this example the frequency dividing circuits 108 and 109 that divide frequency by the same number are inserted instead of the interfaces circuits 105, 106 in front of respective ones of the input terminals of the phase comparator 102 employing the XOR gate in the circuit depicted in FIG. 10. This makes it possible to reduce the frequency input to the phase comparator 102.

As shown in FIG. 12, the reference frequency $f_{REF}$ is supplied from the input terminal 100. The reference frequency $f_{REF}$ becomes one input signal to the XOR gate, which constitutes the phase comparator 102, upon being divided by the frequency dividing circuit 108, which divides by the number n. The VCO 112 supplies oscillation frequency. This signal becomes another input signal to the XOR gate, which constitutes the phase comparator 102, upon being divided by the frequency dividing circuit 109, which divides by the number n. Accordingly, the two input signals of the phase comparator 102 can be utilized as signals having a phase difference between them.

The output signal of the XOR gate is a rectangular waveform having a duty of 1:1. If this signal is smoothened by the loop filter 103 comprising a lag-lead filter, a value of VDD/2 is obtained as a DC voltage. The output voltage of the loop filter 103 is amplified by the differential amplifier 104 (the voltage gain of which is −$G_V$) to which the voltage of VFF/2 is applied as the reference voltage, and the amplified signal becomes the control voltage of the VCO 112. Thus, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

Next, the operation of the circuit shown in FIG. 12 will be described. The VCO 112, frequency dividing circuits 108 and 109, phase comparator 102 and loop filter (lag-lead-type filter) 103 construct a PLL circuit in FIG. 12. On the assumption of utilization at high frequencies, the best arrangement is one in which an LC tank circuit is used as the tank circuit of the VDO 112 and a varactor capacitance whose capacitance value changes depending upon the applied voltage is used as the variable capacitor C.

Further, an XOR gate is used as the phase comparator 102. The XOR gate is a digital circuit. The arrangement takes on the power-supply voltage VDD if the output amplitude is high, and takes on the ground voltage of 0 V if the output amplitude is low. Accordingly, in a case where an XOR gate is used as the phase comparator 102 and the reference voltage is VDD/2, namely one-half the power-supply voltage VDD, the phase difference of 90° (π/2) is produced between the two input signals of the phase comparator 102 if the PLL loop is pulled in and locks. Since a phase difference is thus produced between the entered reference frequency and the output signal of the VCO 112, these two signals are utilized as signals having a phase difference between them.

Here the VCO 112 is made one whose oscillation frequency declines when the control voltage $V_{CON}$ rises. For example, it will suffice if the VCO 112 is made one having a tuning circuit comprising an LC tank circuit, the capacitor C uses a varactor the capacitance value of which can be can be enlarged by applying a voltage across the electrodes, and the capacitance value increases monotonously with respect to an increase in the voltage applied across the electrodes.

If the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

12$^{TH}$ EXAMPLE

Figure 13:
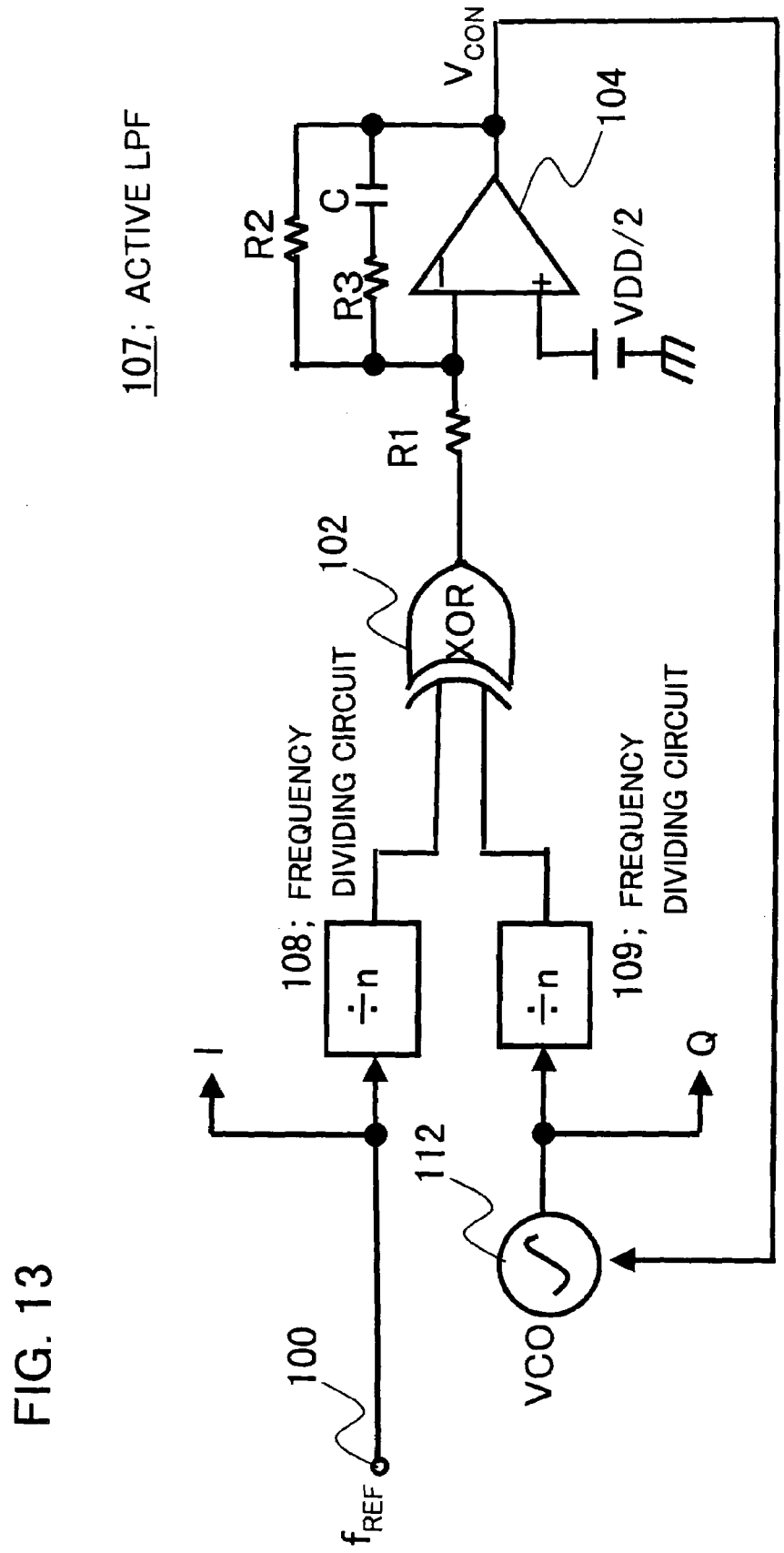
FIG. 13 is a diagram illustrating the configuration of a 12th example of the present invention.
Figure 14:
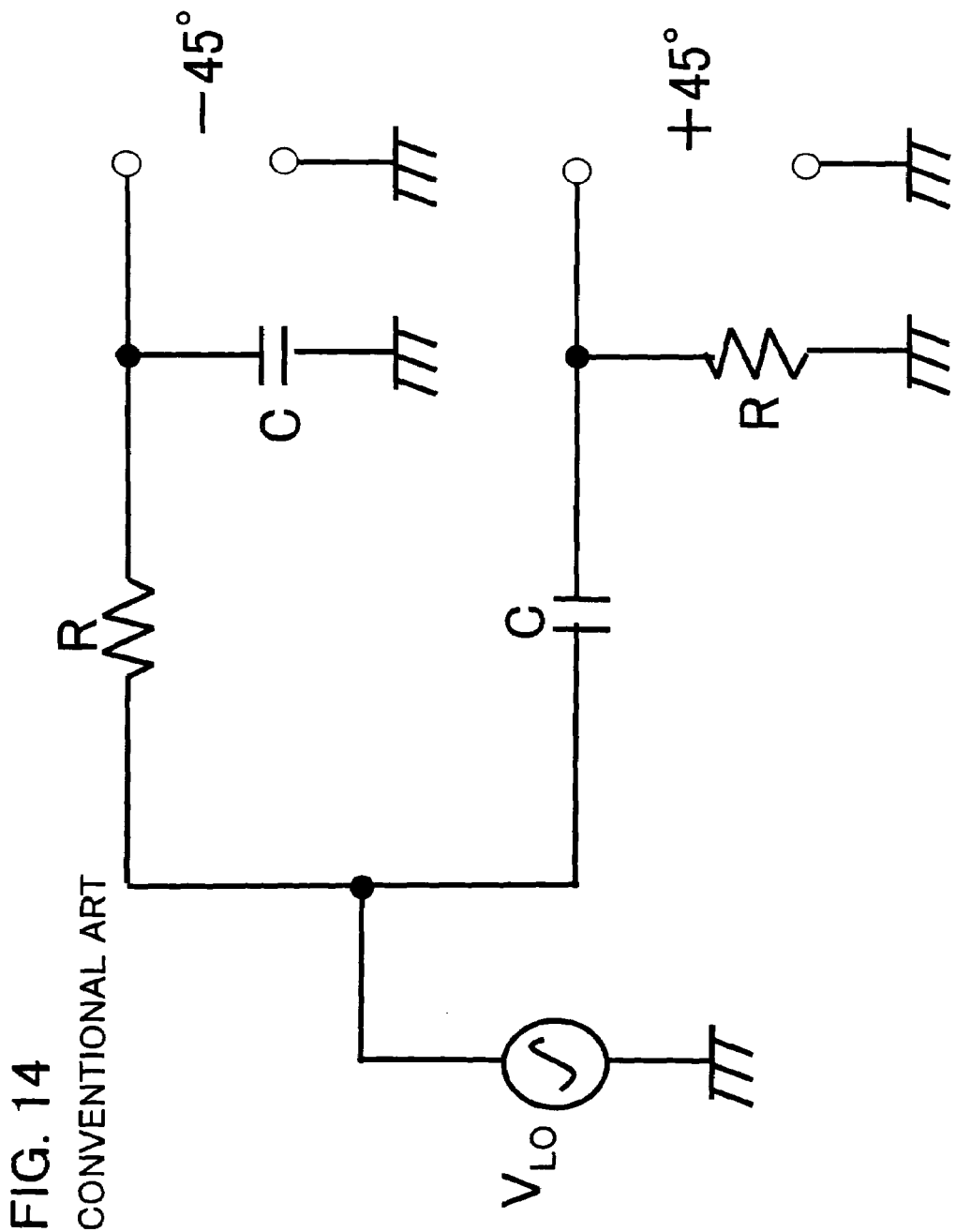
FIG. 14 is a diagram illustrating the configuration of a conventional 90° phase shifting circuit that employs an RC-CR bridge.
Figure 15B:
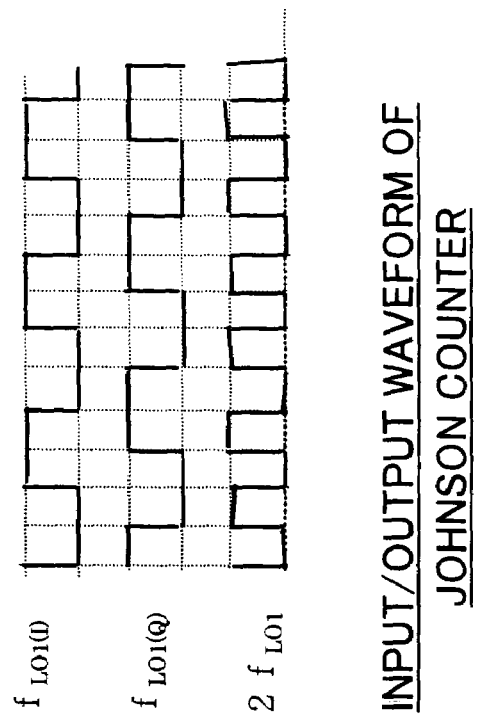
FIGS. 15A and 15B illustrate the configuration of a conventional 90° phase shifting circuit that employs a Johnson counter.
Figure 15A:
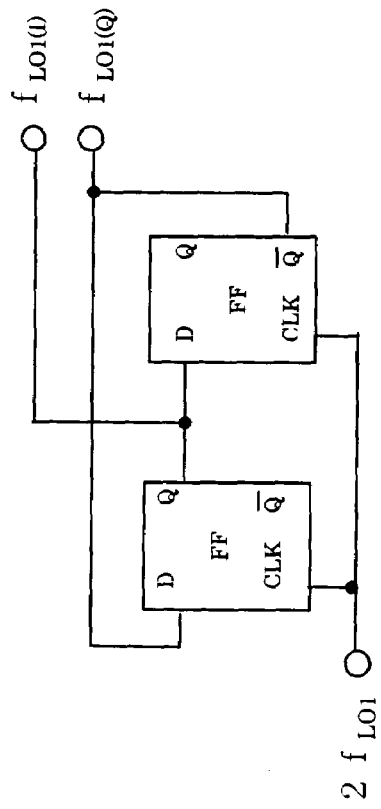
Figure 16:
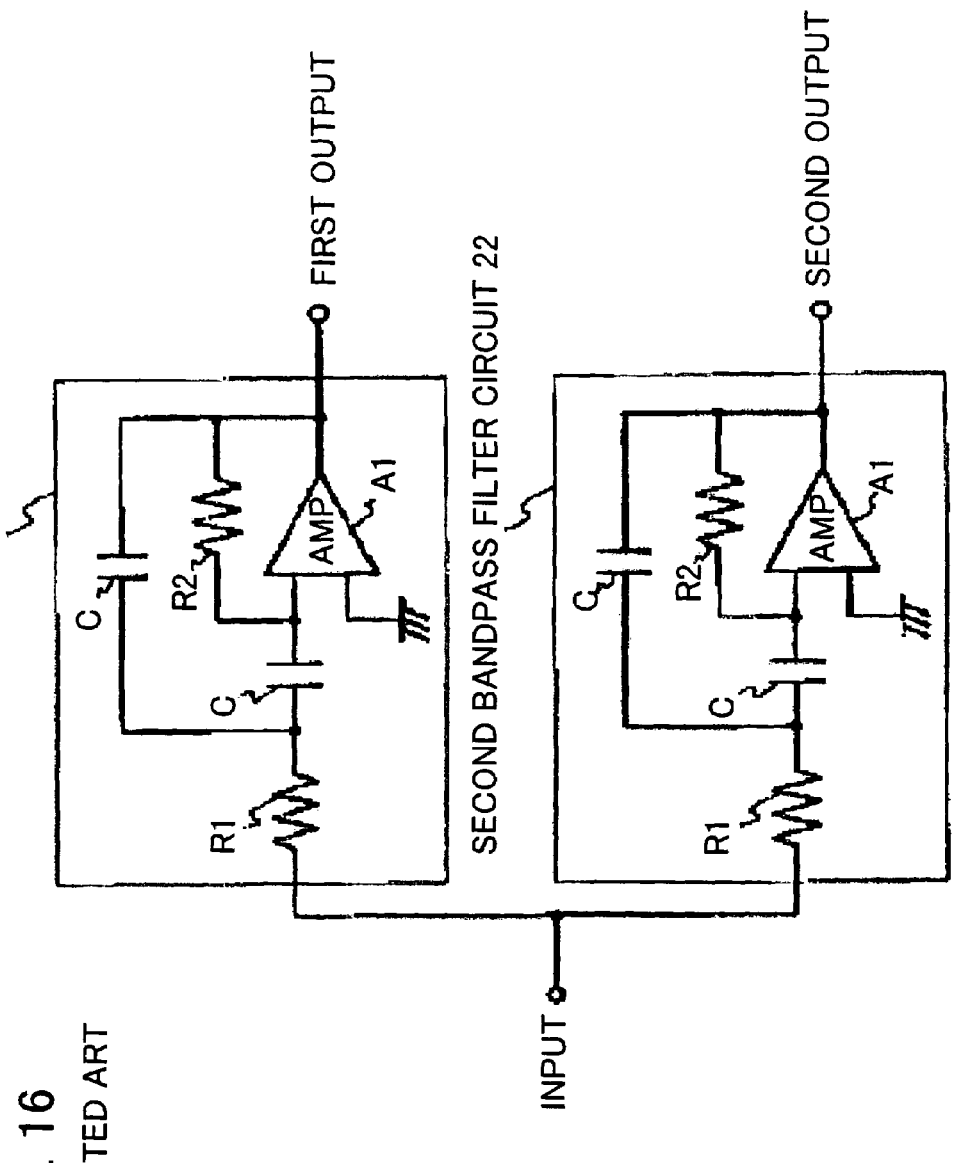
FIG. 16 is a diagram illustrating a circuit arrangement described in Patent Document 1.
Figure 17A:
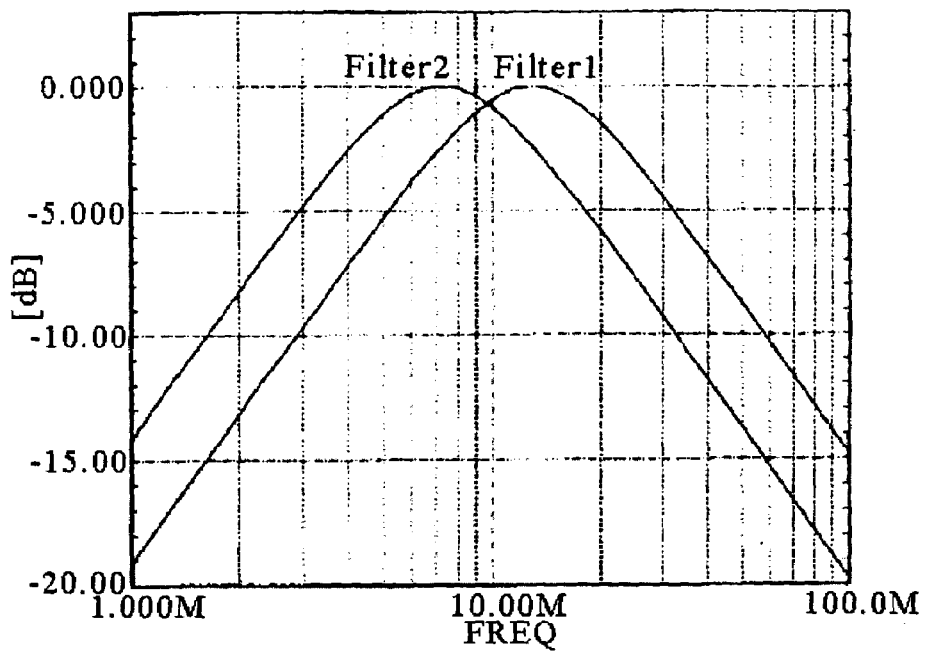
FIGS. 17A and 17B are diagrams illustrating the frequency characteristics of the circuit described in Patent Document 1.
Figure 17B:
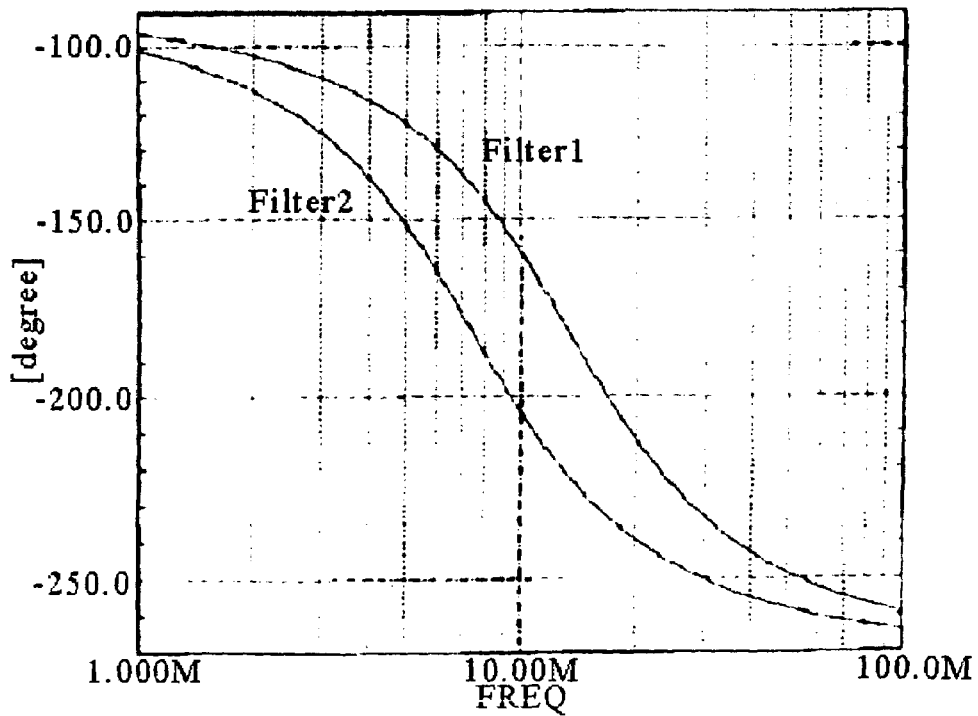
Figure 18:
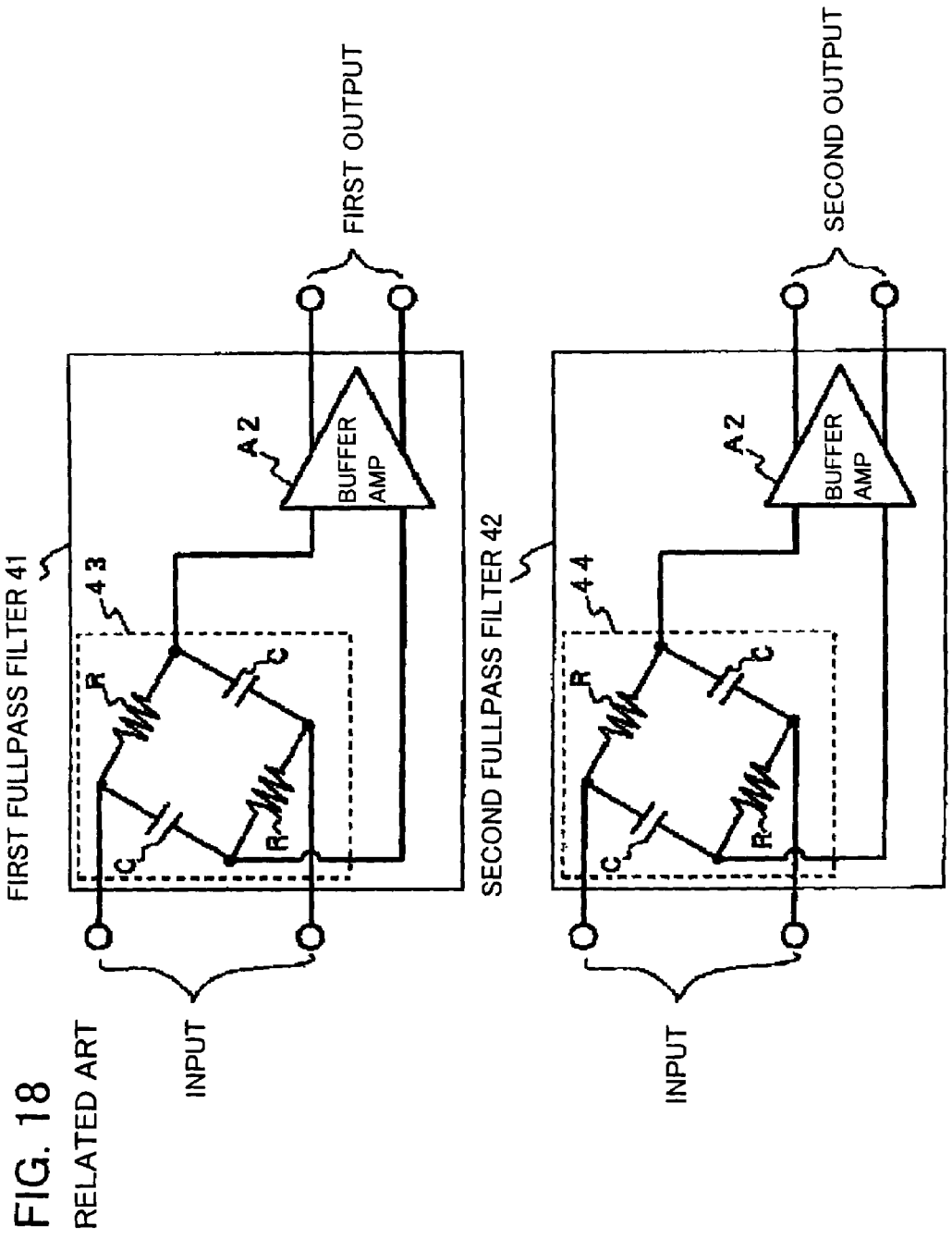
FIG. 18 is a diagram illustrating another circuit arrangement described in Patent Document 1.

FIG. 13 is a diagram illustrating the configuration of a 12th example of the present invention. In this example, the loop filter 103 and differential amplifier 104 of FIG. 12 are combined, as illustrated in FIG. 12.

As shown in FIG. 13, the reference frequency $f_{REF}$ is supplied from the input terminal 100. The reference frequency $f_{REF}$ becomes one input signal to the XOR gate, which constitutes the phase comparator 102, upon being divided by the frequency dividing circuit 108, which divides by the number n. The VCO 112 supplies oscillation frequency. This signal becomes another input signal to the XOR gate, which constitutes the phase comparator 102, upon being divided by the frequency dividing circuit 109, which divides by the number n. Accordingly, the two input signals of the phase comparator 102 can be utilized as signals having a phase difference between them.

The output signal of the XOR gate constituting the phase comparator 102 is a rectangular waveform having a duty of 1:1. If this signal is smoothened, a value of VDD/2, namely one-half the power-supply voltage VDD, is obtained as a DC voltage. This signal is supplied to a loop filter comprising the RC active filter 107 having a lag-lead filter characteristic and a voltage gain. The voltage of VDD/2 is applied as a reference voltage to the non-inverting input terminal (+) of the differential amplifier 104, which constructs part of the RC active filter 107. A series circuit, which is composed of resistor R3 and capacitor C, and resistor R2 are connected in parallel across the inverting input terminal (−) and output terminal of the differential amplifier 104, resistor R1 is connected between the inverting input terminal of the differential amplifier 104 and the output of the XOR gate, and the DC voltage gain $G_V$ is −R2/R1. The signal is amplified with the voltage gain $G_V$, high-frequency components are removed and the resultant signal becomes the control voltage of the VCO 112. That is, a PLL loop is constructed. Accordingly, if the reference voltage to the non-inverting input terminal (+) of the differential amplifier 104 is varied as by changing over some of the voltage-dividing resistors using a switch or the like, the amount of phase shift can be varied.

The operation of the circuit shown in FIG. 13 will be described. The VCO 112, frequency dividing circuits 108 and 109, phase comparator 102 and loop filter (lag-lead-type filter) comprising the RC active filter 107 construct a PLL circuit.

On the assumption of utilization at high frequencies, the best arrangement is one in which a varactor capacitance whose capacitance value changes depending upon the applied voltage is used as the variable capacitor C. Further, an XOR gate is used as the phase comparator 102. The XOR gate is a digital circuit. The arrangement takes on the power-supply voltage VDD if the output amplitude is high, and takes on the ground voltage of 0 V if the output amplitude is low.

Accordingly, in a case where an XOR gate is used as the phase comparator 102 and the reference voltage is VDD/2, namely one-half the power-supply voltage VDD, the phase difference of 90° (π/2) is produced between the two input signals of the phase comparator 102 if the PLL loop is pulled in and locks. Since a phase difference is thus produced between the entered reference frequency and the output signal of the VCO 112, these two signals are utilized as signals having a phase difference between them.

Here the VCO 112 is made one whose oscillation frequency declines when the control voltage $V_{CON}$ rises. For example, it will suffice if the VCO 112 is made one having a tuning circuit comprising an LC tank circuit, the capacitor C uses a varactor the capacitance value of which can be can be enlarged by applying a voltage across the electrodes, and the capacitance value increases monotonously with respect to an increase in the voltage applied across the electrodes.

If the phase comparator 102 operates linearly, the phase difference will be 90° at a reference voltage of VDD/2. Therefore, if the set value of reference voltage has an error of 1%, the phase error will correspond to 1.1°. Accordingly, by varying the reference voltage applied to the non-inverting input terminal (+) of the differential amplifier 104, on the order of ±1% by changing over some voltage-dividing resistors using a switch or the like, the amount of phase shift can be varied on the order to ±1.1%.

Examples of application of the present invention include the following in the front end for a mobile terminal integrated on an LSI chip: a 45° (π/4) phase shifting circuit for a direct-conversion receiving system using a sub-harmonic mixer, a 90° (π/2) phase shifting circuit for an ordinary direct-conversion receiving system, and a 90° (π/2) phase shifting circuit for a quadrature demodulating circuit. The progress that has been made in ever finer patterning in recent integrated circuit processes has been accompanied by improvements in frequency characteristics and growing demand for such circuits in a case where the circuit is integrated on a single chip as an RF-MOS. The present invention is capable of meeting such demand.

As many apparently widely different examples of the present invention can be made without departing from the spirit and scope thereof, it is to be understood that the invention is not limited to the specific examples thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A phase shifting circuit, comprising:
a phase-locked loop (PLL loop) in which a reference frequency signal is received and branched into first and second signals, said PLL loop including:
a phase comparator comprising a first comparator input terminal for receiving the first signal and a second comparator input terminal;
a phase shifter that receives the second signal and phase-shifts the second signal to output a phase-shifted signal, the phase-shifted signal output from said phase shifter being supplied to the second comparator input terminal of said phase comparator;
a low-pass filter that receives an output signal from said phase comparator;
a differential amplifier comprising a first amplifier input terminal connected to an output of said low-pass filter and a second amplifier input terminal; and
first and second frequency dividers that divide frequency by mutually identical numbers, said first and second frequency dividers being inserted in front of respective ones of the first and second input terminals of said phase comparator,
wherein an amount of phase shift by said phase shifter is controlled by an output signal from said differential amplifier, the amount of phase shift by said phase shifter being decided by a reference voltage applied to the second amplifier input terminal of said differential amplifier.

2. The circuit according to claim 1, wherein said low-pass filter and said differential amplifier comprise an active low-pass filter.

3. The circuit according to any one of claim 1, wherein the reference voltage comprises one-fourth of a power supply voltage, and the amount of phase shift comprises π/4.

4. The circuit according to claim 1, further comprising a circuit that varies the reference voltage,
wherein the amount of phase shift by said phase shifter is variably set.

5. The circuit according to claim 1, wherein the signal applied to the second input terminal of said phase comparator comprises the output signal of the phase shifting circuit.

6. The circuit according to claim 1, wherein the comparator circuit comprises an X-OR gate.

7. The circuit according to claim 1, wherein the low-pass filter receives the output signal from the differential amplifier as an input signal thereof.

8. A phase shifting circuit, comprising a phase-locked loop (PLL loop) that includes:
a first phase shifter that receives a reference frequency signal and phase-shifts the reference frequency signal to output a phase-shifted signal, the first phase-shifted signal output from said first phase shifter being branched into first and second signals;
a phase comparator comprising a first comparator input terminal for receiving the first signal and a second comparator input terminal;
a second phase shifter that receives the second signal and phase-shifts the second signal to output a second phase-shifted signal, the second phase-shifted signal output from said second phase shifter being supplied to the second comparator input terminal of said phase comparator;
a low-pass filter that receives an output signal from said phase comparator; and
a differential amplifier comprising a first amplifier input terminal connected to an output of said low-pass filter and a second amplifier input terminal,
wherein amounts of phase shift by said first and second phase shifters are controlled by an output signal from said differential amplifier, the amounts of phase shift by said first and second phase shifters being decided by a reference voltage applied to the second amplifier input terminal of said differential amplifier.

9. The circuit according to claim 8, wherein said low-pass filter and said differential amplifier comprise an active low-pass filter.

10. The circuit according to claim 8, further comprising first and second frequency dividers that divide frequency by mutually identical numbers, said first and second frequency dividers being inserted in front of respective ones of the first and second input terminals of said phase comparator.

11. The circuit according to claim 8, wherein the reference voltage comprises one-fourth of a power supply voltage, the amount of phase shift of each of said first and second phase shifters comprises π/4, and a sum of the amounts of phase shift comprises π/2.

12. The circuit according to claim 8, further comprising a circuit that varies the reference voltage,
wherein the amount of phase shift by said phase shifter is variably set.

13. The circuit according to claim 8, wherein the reference frequency signal that is supplied to said first phase shifter and the signal supplied to the second input terminal of said phase comparator comprises the outputs of the phase shifting circuit.

14. The circuit according to claim 8, wherein the reference frequency and the output of the second phase shifter comprise the same frequency.

15. A phase shifting circuit, comprising a phase-locked loop (PLL loop) that includes:
a phase comparator comprising a first comparator input terminal, for receiving a reference frequency signal, and a second comparator input terminal;
a voltage-controlled oscillator, an oscillation frequency of which is varied by a control voltage applied thereto, an output signal from said voltage-controlled oscillator being supplied to the second comparator input terminal of said phase comparator;
a low-pass filter that receives an output signal from said phase comparator; and
a differential amplifier comprising a first amplifier input terminal connected to an output of said low-pass filter and a second amplifier input terminal,
wherein the oscillation frequency of said voltage-controlled oscillator is controlled by an output signal from said differential amplifier, the amount of phase shift by said phase shifter being decided by a reference voltage applied to the second amplifier input terminal of said differential amplifier.

16. The circuit according to claim 15, wherein said low-pass filter and said differential amplifier comprise an active low-pass filter.

17. The circuit according to claim 15, further comprising first and second frequency dividers that divide frequency by mutually identical numbers, said first and second frequency dividers being inserted in front of respective ones of the first and second input terminals of said phase comparator.

18. The circuit according to claim 15, wherein the reference voltage comprises one-half of a power supply voltage, and the amount of phase shift of said phase shifter comprises $\pi/2$.

19. The circuit according to claim 15, further comprising a circuit that varies the reference voltage, wherein the amount of phase shift by said phase shifter is variably set.

* * * * *